United States Patent
Jalili Sebardan

(10) Patent No.: US 11,128,258 B2
(45) Date of Patent: Sep. 21, 2021

(54) MIXER CIRCUITRY

(71) Applicant: SOCIONEXT INC., Kanagawa (JP)

(72) Inventor: Armin Jalili Sebardan, Maidenhead (GB)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 17/115,349

(22) Filed: Dec. 8, 2020

(65) Prior Publication Data

US 2021/0194432 A1 Jun. 24, 2021

(30) Foreign Application Priority Data

Dec. 20, 2019 (EP) .................. 19219073

(51) Int. Cl.
*H03D 7/14* (2006.01)

(52) U.S. Cl.
CPC .................. *H03D 7/1458* (2013.01)

(58) Field of Classification Search
CPC ...... H03D 7/14; H03D 7/1425; H03D 7/1458; H03D 7/1466; H03D 7/1475; G06G 7/12; G06G 7/16
See application file for complete search history.

(56) References Cited

U.S. PATENT DOCUMENTS

| | | | |
|---|---|---|---|
| 6,211,718 B1 | 4/2001 | Souetinov | |
| 6,348,830 B1 | 2/2002 | Rebeiz et al. | |
| 7,356,317 B2 | 4/2008 | Xu et al. | |
| 9,306,540 B2 | 4/2016 | Lin et al. | |
| 2006/0014509 A1 | 1/2006 | Xu et al. | |
| 2008/0284488 A1 | 11/2008 | Sanduleanu et al. | |
| 2009/0111377 A1* | 4/2009 | Mitomo | H03D 7/1441 455/20 |

(Continued)

FOREIGN PATENT DOCUMENTS

| | | |
|---|---|---|
| CN | 106603013 A | 4/2017 |
| EP | 0 859 460 A1 | 8/1998 |

OTHER PUBLICATIONS

Partial European Search Report dated Jun. 26, 2020 issued in European Patent Application No. 19219073.4.

(Continued)

*Primary Examiner* — Diana J. Cheng
(74) *Attorney, Agent, or Firm* — McDermott Will and Emery LLP

(57) ABSTRACT

Differential mixer circuitry comprising: first and second input-voltage nodes and first and second input-current nodes; a passive network of impedances connected between the first and second input-voltage nodes and the first and second input-current nodes, and configured to convert first and second input-voltage signals received at the first and second input-voltage nodes, respectively, into first and second input-current signals provided at the first and second input-current nodes, respectively, the first and second input-voltage signals defining a differential input-voltage signal having an input frequency, and the first and second input-current signals defining a differential input-current signal; and a mixing stage configured to mix the differential input-current signal with at least one mixing signal having a corresponding mixing frequency and output a differential output signal having an output frequency dependent on the input frequency and each mixing frequency.

17 Claims, 24 Drawing Sheets

(56) References Cited

U.S. PATENT DOCUMENTS

2011/0095807 A1\* 4/2011 de Jong ............... H03D 7/1441
  327/361
2015/0303897 A1 10/2015 Lin et al.

OTHER PUBLICATIONS

Extended European Search Report dated Sep. 30, 2020 issued in European Patent Application No. 19219073.4.

\* cited by examiner

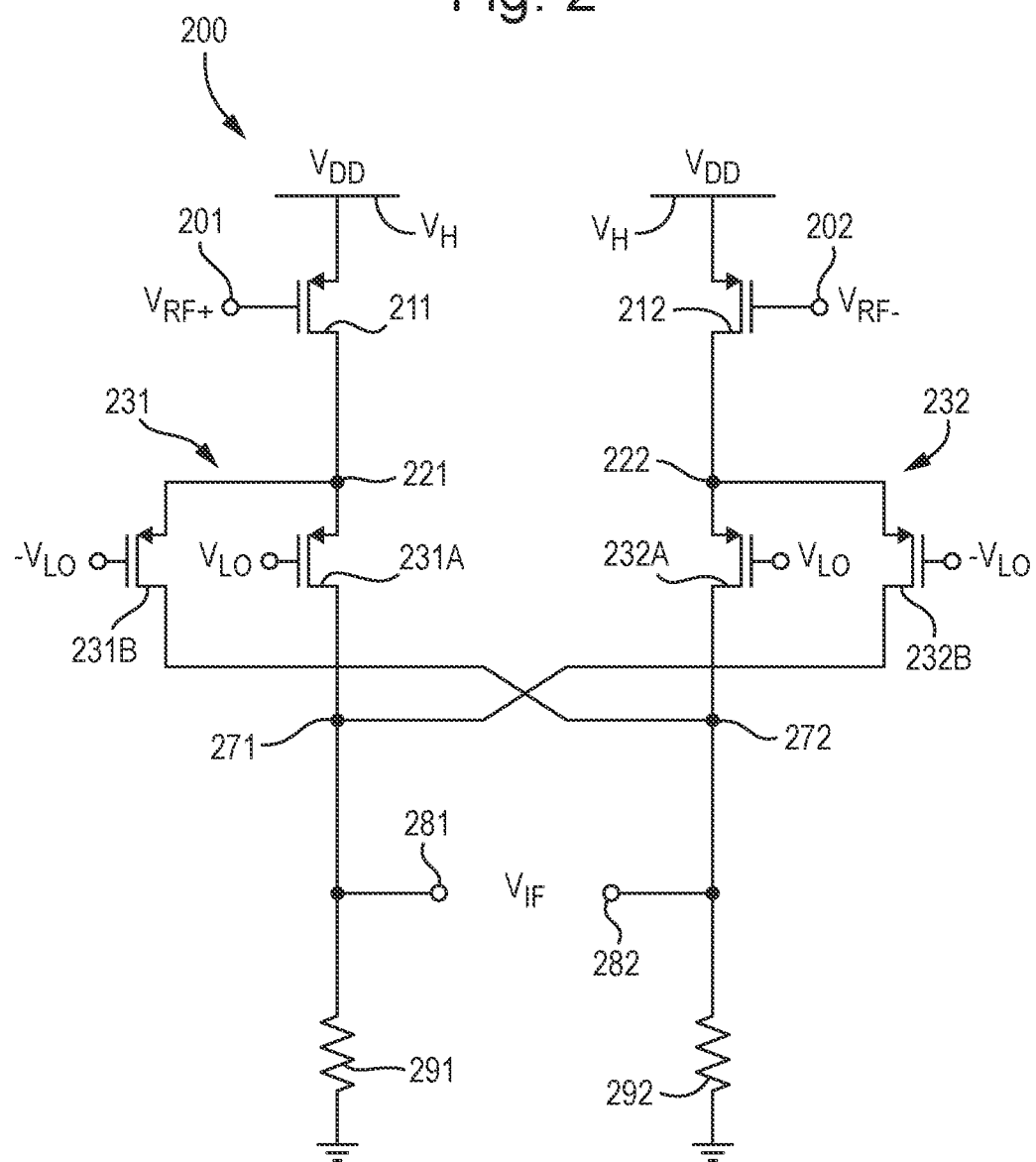

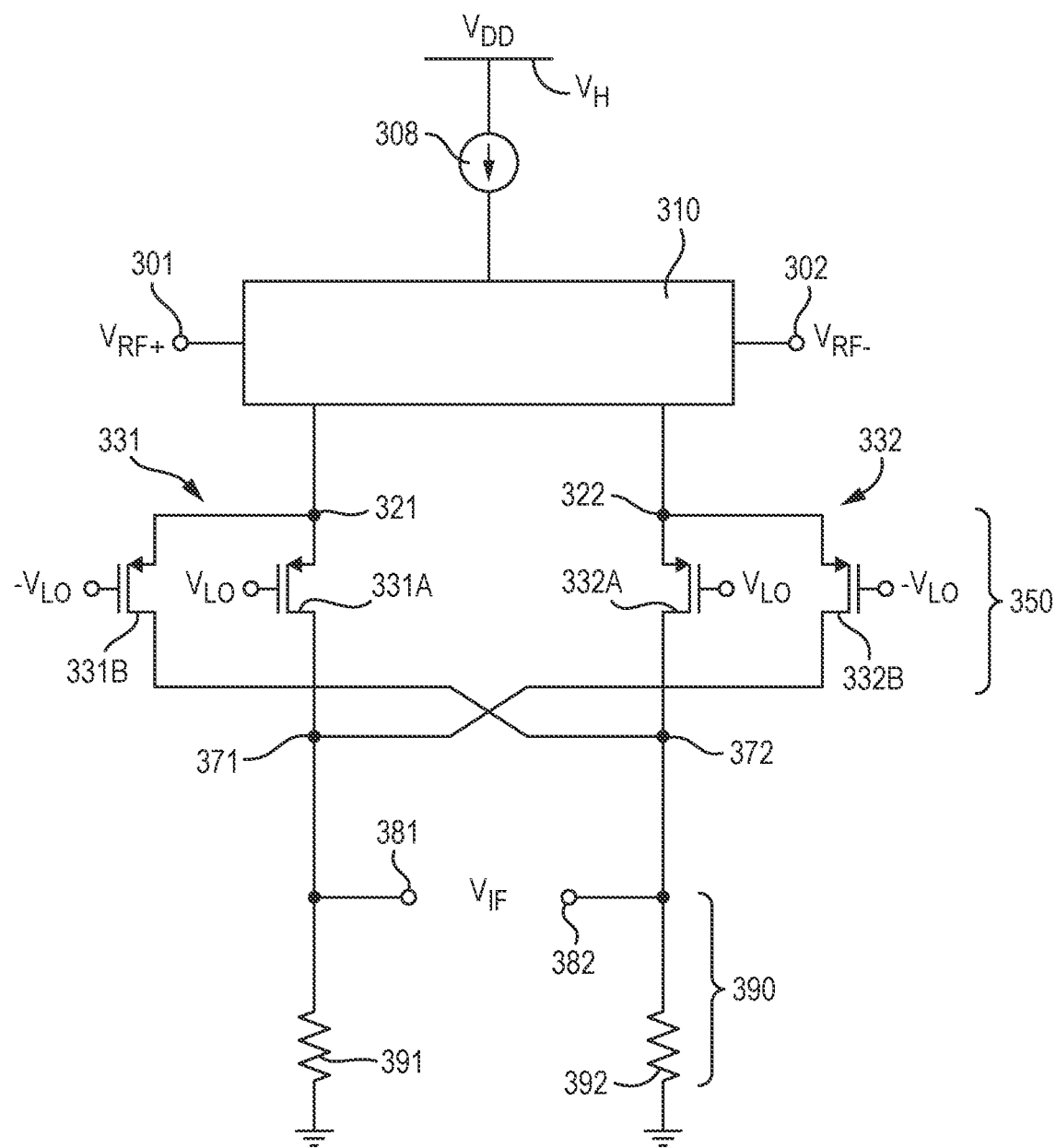

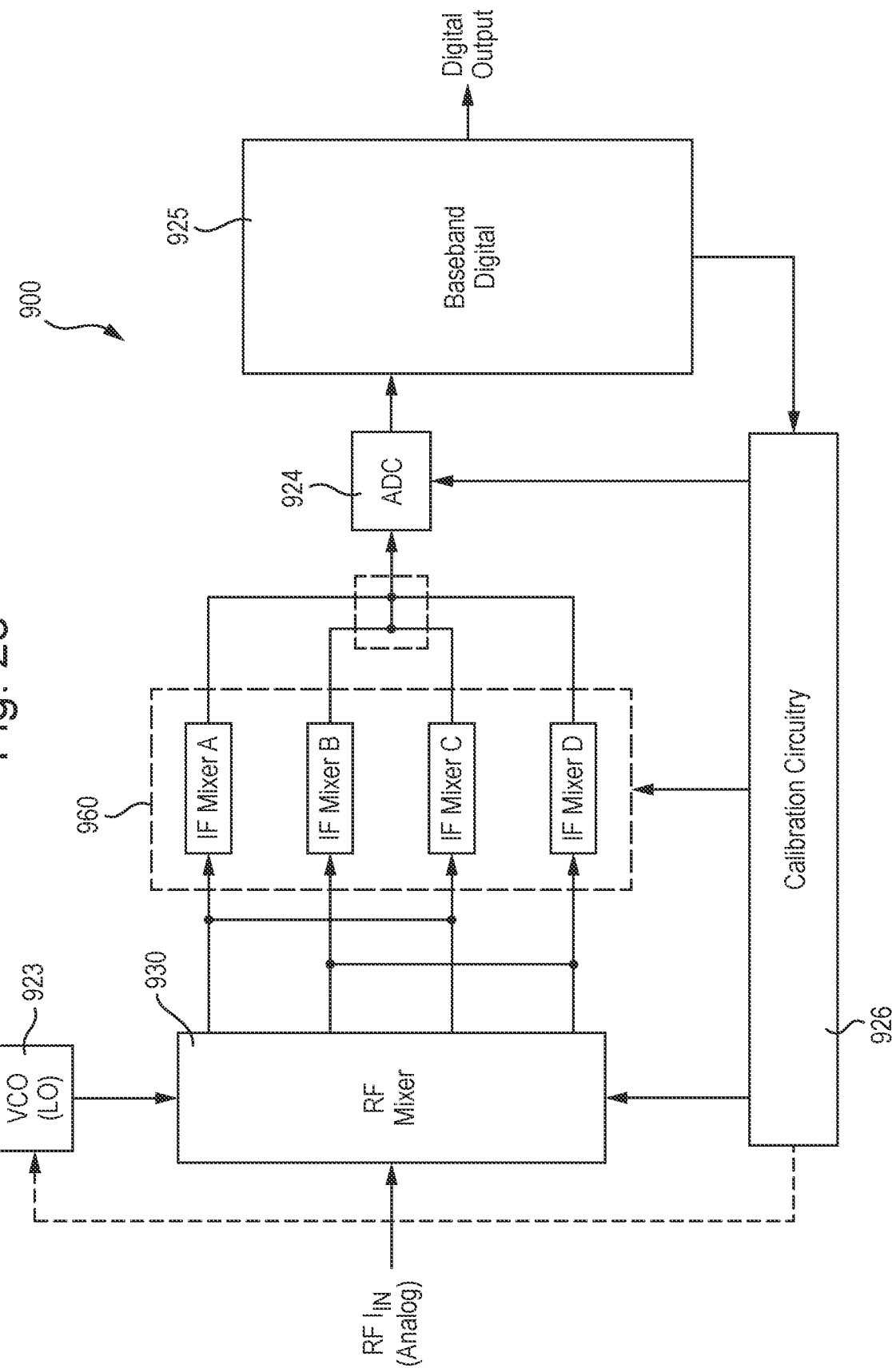

MIXER CIRCUITRY

CROSS-REFERENCE OF RELATED APPLICATIONS

This application claims the benefit of European Patent Application No. 19219073.4, filed on Dec. 20, 2019, the entire disclosure of which Application is incorporated by reference herein.

The present invention relates to frequency mixer circuitry, referred to herein as mixer circuitry. In particular, the present invention relates to differential mixer circuitry.

In such mixer circuitry, an input signal having an input frequency (e.g. radio frequency (RF)) may be received, and an output signal having an output frequency (e.g. baseband (BB) or intermediate frequency (IF)) may be generated based on the input signal and a mixing signal (having a mixing frequency) in a process referred to as heterodyning or mixing. Such circuitry may be implemented as integrated circuitry, for example on an IC chip. In the context of integrated circuitry, a transistor may be employed as a mixing device, as is generally known.

It will be understood that the output frequency may be lower in frequency than the input frequency (as in the above example) or higher in frequency than the input frequency. Such circuitry could for example be used in a receiver circuit, such as a radio receiver circuit, or in a transmitter circuit, such as a radio transmitter circuit.

It is desirable to provide improved mixer circuitry, in particular for implementation as integrated circuitry, for example on an IC chip.

According to an embodiment of a first aspect of the present invention, there is provided differential mixer circuitry comprising: first and second input-voltage nodes and first and second input-current nodes; a passive network of impedances connected between the first and second input-voltage nodes and the first and second input-current nodes, and configured to convert first and second input-voltage signals received at the first and second input-voltage nodes, respectively, into first and second input-current signals provided at the first and second input-current nodes, respectively, the first and second input-voltage signals defining a differential input-voltage signal having an input frequency, and the first and second input-current signals defining a differential input-current signal; and a mixing stage configured to mix the differential input-current signal with at least one mixing signal having a corresponding mixing frequency and output a differential output signal having an output frequency dependent on the input frequency and each mixing frequency.

The mixing stage may be considered to frequency mix the differential input-current signal with the at least one mixing signal.

Such differential mixing circuitry enables the frequency of a signal to be changed to a lower or a higher frequency. That is, the output frequency may be higher or lower than the input frequency. The passive network of impedances enables the differential input-voltage signal to be converted into the differential input-current signal without the use of e.g. one or more switches (transistors). The passive network of impedances can provide the required matching between the differential mixer circuitry and circuitry of a preceding stage. This passive voltage-to-current conversion can lead to improved speed and/or improved linearity and/or higher dynamic range than other techniques.

The passive network of impedances may comprise a tail node for connection to a voltage source, a first tail-side impedance connected between the first input-voltage node and the tail node and a first mixer-side impedance connected between the first input-voltage node and the first input-current node, and a second tail-side impedance connected between the second input-voltage node and the tail node and a second mixer-side impedance connected between the second input-voltage node and the second input-current node.

The first and second tail-side impedances and the first and second mixer-side impedances may be resistors. In this case, the passive network of impedances may be referred to as a resistive network.

The passive network of impedances may comprise a tail node for connection to a voltage source, a first tail-side impedance connected between the first input-current node and the tail node and a first input-side impedance connected between the first input-current node and the first input-voltage node, and a second tail-side impedance connected between the second input-current node and the tail node and a second input-side impedance connected between the second input-current node and the second input-voltage node.

The first and second tail-side impedances may be inductors. The first and second input-side impedances may be resistors.

The tail node may be connected to the voltage source via a current source. The current source may be configured to control or regulate a bias current flowing through the tail node.

The impedances of the passive network of impedances may be or may comprise resistors and/or inductors.

The differential mixer circuitry may comprise first and second output-current nodes. The mixing stage may be connected between the first and second input-current nodes and the first and second output-current nodes. The mixing stage may be configured to mix the first and second input-current signals with the at least one mixing signal to generate first and second output-current signals at the first and second output-current nodes, respectively, and defining the differential output signal.

The passive network of impedances may be considered to form a voltage-to-current conversion stage of the differential mixer circuitry. The differential mixer circuitry may comprise a current-to-voltage conversion stage connected to the output-current nodes and configured to convert the first and second output-current signals provided at the first and second output-current nodes, respectively, into first and second output-voltage signals also provided at the first and second output-current nodes, respectively.

The mixing stage may comprise at least a first mixer sub-stage, where $X \geq 2$. The first mixer sub-stage may comprise first and second arrays of switches each comprising X switches, X upstream nodes and X downstream nodes, the switches of each array connected between the upstream nodes and the downstream nodes, respectively, of that array along respective current paths. The upstream nodes of the first array of the first mixer sub-stage may be connected to the first input-current node and the upstream nodes of the second array of the first mixer sub-stage may be connected to the second input-current node. The downstream nodes of the first and second arrays of the first mixer sub-stage may be connected to the output-current nodes along current paths arranged so that said first and second output-current signals are provided at the first and second output-current nodes, respectively. In a first operation mode of the differential mixer circuitry, the at least one mixing signal may comprise at least a first sub-stage mixing signal being an X-phase mixing signal and the switches of each array may be configured to be controlled by respective phases of the first sub-stage mixing signal.

X may be ≥3, X may be ≥4, or X may be ≥8.

The mixing stage may comprise at least a second mixer sub-stage comprising a plurality of arrays of switches each comprising Y switches, Y upstream nodes and Y downstream nodes, where Y≥2, the switches of each array connected between the upstream nodes and the downstream nodes, respectively, of that array along respective current paths. The downstream nodes of the first and second arrays of the first mixer sub-stage may be connected to the output-current nodes along current paths arranged to pass via the switches of the arrays of the second mixer sub-stage so that said first and second output-current signals are provided at the first and second output-current nodes, respectively. In the first operation mode, the at least one mixing signal may comprise at least a second sub-stage mixing signal being a Y-phase mixing signal, and the switches of each array of the second mixer sub-stage may be configured to be controlled by respective phases of the second sub-stage mixing signal.

In a second operation mode (potentially instead of the first operation mode) of the differential mixer circuitry: the X switches of each array of the first mixer sub-stage may be configured to be controlled by respective phases of the first sub-stage mixing signal and the Y switches of each array of the second mixer sub-stage may be configured to be controlled by respective control signals so that some of them are (maintained) ON and some of them are (maintained) OFF; or the Y switches of each array of the second mixer sub-stage may be configured to be controlled by respective phases of the second sub-stage mixing signal and the X switches of each array of the first mixer sub-stage may be configured to be controlled by respective control signals so that some of them are (maintained) ON and some of them are (maintained) OFF.

Either the first operation mode or the second operation mode may be referred to simply as a particular or given operation mode. The circuitry may be selectively operable in the first operation mode or the second operation mode. The circuitry may be operable in only one of the first operation mode and the second operation mode, Y may be ≥3, or Y may be ≥4, or Y may be ≥8. X may be equal to Y. X and/or Y may be an even number and may be equal to $2^N$ where N is a positive integer.

The switches of the first and second mixer sub-stages may be transistors, such as field-effect transistors.

According to an embodiment of a second aspect of the present invention, there is provided differential mixer circuitry comprising: first and second input-current nodes configured to receive first and second input-current signals, respectively, the first and second input-current signals defining a differential input-current signal having an input frequency; first and second output-current nodes configured to output first and second output-current signals, respectively, the first and second output-current signals defining a differential output-current signal; and a mixing stage connected between the first and second input-current nodes and the first and second output-current nodes, and configured to mix the differential input-current signal with at least one mixing signal having a corresponding mixing frequency to generate the differential output-current signal having an output frequency dependent on the input frequency and each mixing frequency, wherein: the mixing stage comprises a first mixer sub-stage and a second mixer sub-stage; and wherein: the first mixer sub-stage is configured to perform at least part of the mixing with a first sub-stage mixing signal which is an X-phase mixing signal having a first mixing frequency, where X≥4 (or X≥2 or X≥3); and/or the second mixer sub-stage is configured to perform at least part of the mixing with a second sub-stage mixing signal which is a Y-phase mixing signal having a second mixing frequency, where Y≥4 (or Y≥2 or Y≥3).

The first mixer sub-stage may comprise first and second arrays of switches each comprising X switches, X upstream nodes and X downstream nodes, the switches of each of those arrays connected between the upstream nodes and the downstream nodes, respectively, of that array. The second mixer sub-stage may comprise a plurality of arrays of switches each comprising Y switches, Y upstream nodes and Y downstream nodes, the switches of each of those arrays connected between the upstream nodes and the downstream nodes, respectively, of that array. A series of current paths may connect the input-current nodes to the output-current nodes, each of those current paths passing from one of the input-current nodes via a switch of the first mixer sub-stage from its upstream node to its downstream node, via a switch of the second mixer sub-stage from its upstream node to its downstream node and then to one of the output-current nodes. The X switches of each array of the first mixer sub-stage may be configured to be controlled by respective phases of the first sub-stage mixing signal. The Y switches of each array of the second mixer sub-stage may be configured to be controlled by respective phases of the second sub-stage mixing signal.

According to an embodiment of a third aspect of the present invention, there is provided differential mixer circuitry comprising: first and second input-current nodes configured to receive first and second input-current signals, respectively, the first and second input-current signals defining a differential input-current signal having an input frequency; first and second output-current nodes configured to output first and second output-current signals, respectively, the first and second output-current signals defining a differential output-current signal; and a mixing stage connected between the first and second input-current nodes and the first and second output-current nodes, and configured to mix the differential input-current signal with at least one mixing signal having a corresponding mixing frequency to generate the differential output-current signal having an output frequency dependent on the input frequency and each mixing frequency, wherein: the mixing stage comprises a first mixer sub-stage and a second mixer sub-stage; the first mixer sub-stage comprises first and second arrays of switches each comprising X switches, X upstream nodes and X downstream nodes, where X≥4 (or X≥2 or X≥3), the switches of each of those arrays connected between the upstream nodes and the downstream nodes, respectively, of that array; the second mixer sub-stage comprises a plurality of arrays of switches each comprising Y switches, Y upstream nodes and Y downstream nodes, where Y≥4 (or Y≥2 or Y≥3), the switches of each of those arrays connected between the upstream nodes and the downstream nodes, respectively, of that array; and a series of current paths connect the input-current nodes to the output-current nodes, each of those current paths passing from one of the input-current nodes via a switch of the first mixer sub-stage from its upstream node to its downstream node, via a switch of the second mixer sub-stage from its upstream node to its downstream node and then to one of the output-current nodes, and wherein: the X switches of each array of the first mixer sub-stage are configured to be controlled by respective phases of a first sub-stage mixing signal which is an X-phase mixing signal having a first mixing frequency; and/or the Y switches of each array of the second mixer sub-stage are configured to be controlled by respective phases of a second sub-stage mixing signal which is a Y-phase mixing signal having a second mixing frequency.

Optional features in relation to the aforementioned second and/or third aspects of the present invention may be provided as follows.

The mixing stage may be considered to frequency mix the differential input-current signal with the at least one mixing signal.

Such differential mixing circuitry enables the frequency of a signal to be changed to a lower or a higher frequency. That is, the output frequency may be higher or lower than the input frequency.

In a first operation mode of the differential mixer circuitry, the X switches of each array of the first mixer sub-stage may be configured to be controlled by respective phases of the first sub-stage mixing signal, and the Y switches of each array of the second mixer sub-stage may be configured to be controlled by respective phases of the second sub-stage mixing signal.

In a second operation mode of the differential mixer circuitry: the X switches of each array of the first mixer sub-stage may be configured to be controlled by respective phases of the first sub-stage mixing signal and the Y switches of each array of the second mixer sub-stage may be configured to be controlled by respective control signals so that some of them are (maintained) ON and some of them are (maintained) OFF; or the Y switches of each array of the second mixer sub-stage may be configured to be controlled by respective phases of the second sub-stage mixing signal and the X switches of each array of the first mixer sub-stage may be configured to be controlled by respective control signals so that some of them are (maintained) ON and some of them are (maintained) OFF.

The upstream nodes of the first array of the first mixer sub-stage may be connected to the first input-current node and the upstream nodes of the second array of the first mixer sub-stage may be connected to the second input-current node.

The series of current paths may be configured such that the differential mixer circuitry is configured, in the first and/or second mode of operation, as single-balanced or double-balanced or triple-balanced differential mixer circuitry. This has the advantage that unwanted components at the frequencies of the input signals (first sub-stage mixing signal and/or second sub-stage mixing signal, and/or as well as input-voltage signal) are canceled at the outputs.

The downstream nodes of the first and second arrays of the first mixer sub-stage may be connected to the output-current nodes along current paths arranged to pass via the switches of the arrays of the second mixer sub-stage so that, in the first operation mode, between the first and second mixer sub-stages and between the second mixer sub-stage and the output nodes, current paths carrying signals having like phases are summed together to provide the first and second output current signals at the first and second output-current nodes, respectively. In other words, the differential mixer circuitry may be balanced with respect to the first and second sub-stage mixing signals (i.e. double- and/or triple-balanced).

The downstream nodes of the first and second arrays of the first mixer sub-stage may be connected to the output-current nodes along current paths arranged to pass via the switches of the arrays of the second mixer sub-stage so that, in the second operation mode, between the first and second mixer sub-stages and/or between the second mixer sub-stage and the output nodes, current paths carrying signals having like phases are summed together to provide the first and second output current signals at the first and second output-current nodes, respectively. In other words, the differential mixer circuitry may be balanced with respect to the first and/or second sub-stage mixing signals (i.e., double- and/or triple-balanced).

The downstream nodes of the first and second arrays of the first mixer sub-stage may be connected to the output-current nodes so that current paths from the downstream nodes of the first array are summed with current paths from the downstream nodes of the second array, respectively. In other words, the differential mixer circuitry may be balanced with respect to the differential input-voltage signal.

The downstream nodes of the first and second arrays of the first mixer sub-stage may be connected to the output-current nodes so that current paths from downstream nodes of the first mixer sub-stage connected to switches controlled by opposite phases of the first sub-stage mixing signal are summed together. In other words, the differential mixer circuitry may be balanced with respect to the first sub-stage mixing signal.

The downstream nodes of the arrays of the second mixer sub-stage may be connected to the output-current nodes so that current paths from downstream nodes of the second mixer sub-stage connected to switches controlled by opposite phases of the second sub-stage mixing signal are summed together. In other words, the differential mixer circuitry may be balanced with respect to the second sub-stage mixing signal.

The downstream nodes of the arrays of the second mixer sub-stage may be connected to the output-current nodes so that current paths from downstream nodes of the second mixer sub-stage connected to switches controlled respectively by the Y phases of the second sub-stage clock signal are summed together. That is, the first and second output-current signals may each have contributions from all Y phases of the second sub-stage mixing signal.

X may be $\geq 3$, or X may be $\geq 4$, or X may be $\geq 8$. Y may be $\geq 3$, or Y may be $\geq 4$, or Y may be $\geq 8$. X may be $\geq 4$ and Y may be $\geq 2$. X may be equal to Y. X and/or Y may be an even number and may be equal to $2^N$ where N is a positive integer.

When X=4, the four phases of the first sub-stage mixing signal may be phases in quadrature. When Y=4, the four phases of the second sub-stage mixing signal may be phases in quadrature.

The differential mixer circuitry may comprise third and fourth output-current nodes; and the downstream nodes of the first and second arrays of the first mixer sub-stage may be connected to the output-current nodes along current paths via the switches of the arrays of the second mixer sub-stage so that first to fourth output-current signals whose phases are in quadrature are provided at the first to fourth output-current nodes, respectively.

The second mixer sub-stage may comprise at least four of said arrays of switches each comprising Y switches.

X may be $\geq 4$ and Y may be $\geq 2$, and the second mixer sub-stage may comprise at least four of said arrays of switches each comprising Y switches. X may be $\geq 2$ and Y may be $\geq 4$, and the second mixer sub-stage may comprise at least two of said arrays of switches each comprising switches. X may be $\geq 4$ and Y may be $\geq 4$, and the second mixer sub-stage may comprise at least two of said arrays of switches each comprising Y switches. X may be $\geq 4$ and Y may be $\geq 4$, and the second mixer sub-stage may comprise at least four of said arrays of switches each comprising Y switches. X may be ≥8 and Y may be ≥8, and the second mixer sub-stage may comprise at least two of said arrays of switches each comprising Y switches.

In the second operation mode the control signals may be configured to control the respective switches so that some of those switches are (maintained) ON to connect downstream nodes to output-current nodes so that the output-current signals are provided at the output-current nodes.

In the second operation mode the control signals may be configured to control the respective switches so that some of those switches are (maintained) ON to connect downstream nodes to output-current nodes so that (at each of those switches) current paths carrying signals having different phases to one another are summed.

The switches of the first and second mixer sub-stages may be transistors, such as field-effect transistors.

The differential mixer circuitry may comprise: first and second input-voltage nodes and first and second input-current nodes; and a passive network of impedances connected between the first and second input-voltage nodes and the first and second input-current nodes, and configured to convert first and second input-voltage signals received at the first and second input-voltage nodes, respectively, into the first and second input-current signals provided at the first and second input-current nodes, respectively, the first and second input-voltage signals defining a differential input-voltage signal having said input frequency.

The passive network of impedances enables the differential input-voltage signal to be converted into the differential input-current signal without the use of e.g. one or more switches (transistors). The passive network of impedances can provide the required matching between the differential mixer circuitry and circuitry of the preceding stage. This passive voltage-to-current conversion can lead to improved speed and/or improved linearity and/or higher dynamic range than other techniques.

The passive network of impedances may comprise a tail node for connection to a voltage source, a first tail-side impedance connected between the first input-voltage node and the tail node and a first mixer-side impedance connected between the first input-voltage node and the first input-current node, and a second tail-side impedance connected between the second input-voltage node and the tail node and a second mixer-side impedance connected between the second input-voltage ode and the second input-current node.

The passive network of impedances may comprise a tail node for connection to a voltage source, a first tail-side impedance connected between the first input-current node and the tail node and a first input-side impedance connected between the first input-current node and the first input-voltage node, and a second tail-side impedance connected between the second input-current node and the tail node and a second input-side impedance connected between the second input-current node and the second input-voltage node.

The differential mixer circuitry (of any of the aforementioned aspects) may comprise a pair of auxiliary transistors with their source terminals connected via respective impedances to respective auxiliary voltage sources, with their drain terminals connected to respective nodes at corresponding locations on a pair of said current paths carrying current signals having opposing phases, respectively, and with their gate terminals connected to each other's drain terminals.

The differential mixer circuitry (of any of the aforementioned aspects) may comprise a pair of auxiliary transistors with their source terminals connected via respective impedances to respective auxiliary voltage sources, with their drain terminals connected to the second and first input-current nodes, respectively, and with their gate terminals connected to the first and second input-current nodes, respectively.

The differential mixer circuitry (of any of the aforementioned aspects) may comprise a pair of auxiliary transistors with their source terminals connected via respective impedances to respective auxiliary voltage sources, with their drain terminals connected to the second and first output-current nodes, respectively, and with their gate terminals connected to the first and second output-current nodes, respectively.

The differential mixer circuitry (of any of the aforementioned aspects) may comprise a pair of auxiliary transistors with their source terminals connected via respective impedances to respective auxiliary voltage sources, with their drain terminals connected to the fourth and third output-current nodes, respectively, and with their gate terminals connected to the third and fourth output-current nodes, respectively.

Such auxiliary transistors may provide gain "boosting" (e.g. at high frequency, compared to at DC) to the differential mixer circuitry, That is, the gain of the differential mixer circuitry can be boosted or improved by the auxiliary transistors.

For each pair of auxiliary transistors, the auxiliary voltage sources may have the same voltage level as each other or different voltage levels from one another.

According to an embodiment of a fourth aspect of the present invention, there is provided analogue-to-digital converter circuitry comprising: differential mixer circuitry configured to: receive an analogue differential input-current signal having an input frequency; mix the differential input-current signal with first and second sub-stage mixing signals having first and second mixing frequencies, respectively; and output an analogue differential output-current signal having an output frequency dependent on the input frequency and the first and second mixing frequencies; and an (e.g. current-mode) analogue-to-digital converter configured to convert the analogue differential output-current signal into a digital signal, wherein the differential mixer circuitry comprises first and second mixer sub-stages, the first mixer sub-stage configured to be controlled by X phases of a first sub-stage mixing signal and the second mixer sub-stage configured to be controlled by Y phases of a second sub-stage mixing signal, where X≥4 (or X≥2 or X≥3) and Y≥4 (or Y≥2 or Y≥3).

According to an embodiment of a fifth aspect of the present invention, there is provided analogue-to-digital converter circuitry comprising the circuitry of any of the aforementioned first to third aspects.

The differential output-current signal or the differential output-voltage signal, as the case may be, may be an analogue differential output signal, and the analogue-to-digital converter circuitry may comprise an analogue-to-digital converter configured to convert the analogue differential output signal into a digital (differential output) signal.

According to an embodiment of a sixth aspect of the present invention, there is provided integrated circuitry such as an IC chip, and/or ADC circuitry, comprising the circuitry of any of the aforementioned first to fifth aspects.

Features of any of the above aspects can be applied to any others of the above aspects.

Reference will now be made, by way of example, to the accompanying drawings, of which:

FIG. 2 is a schematic diagram of modified mixer circuitry, as a comparative example;

FIG. 3 is a schematic diagram of a first example arrangement of mixer circuitry;

FIG. 23 is a schematic diagram of another modified second example arrangement of mixer circuitry;

FIG. 1A is a schematic diagram of mixer circuitry 100, as a comparative example.

Figure 1A:
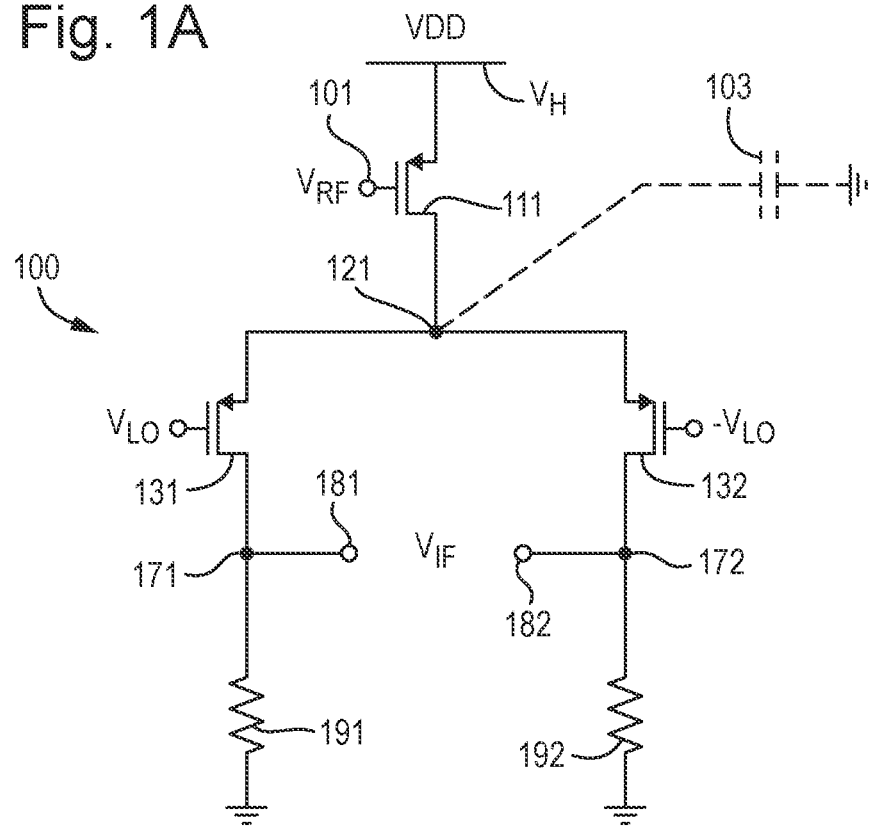
FIG. 1A is a schematic diagram of mixer circuitry, as a comparative example.

Mixer circuitry 100 comprises an input-voltage node 101 configured to receive an input-voltage signal, $V_{RF}$. The input-voltage node 101 is connected to a conversion switch 111 so that the input-voltage signal controls the conversion switch 111. The conversion switch 111 is connected between a high voltage reference (or source) $V_H$ and an input-current node 121. Mixer circuitry 100 comprises a first mixer switch 131 connected between the input-current node 121 and a first current output node 171, and a second mixer switch 132 connected between the input-current node 121 and a second current output node 172, In the present example, the switches 111, 131 and 132 are field-effect transistors, in particular PMOS MOSFETs. Mixer circuitry 100 further comprises a first resistor 191 connected between the first current output node 171 and a low voltage reference (which is lower than the high voltage reference $V_H$) and a second resistor 192 connected between the second current output node 172 and a low voltage reference (or source), which is lower in voltage than the high voltage reference $V_H$.

The conversion switch 111 converts the input-voltage signal $V_{RF}$ into an input-current signal provided at the input-current node 121. The input-current signal (RF current) is steered down through one or other of the first and second mixer switches 131 and 132, based on their control by opposite phases of a mixing signal, $V_{LO}$ (where LO can be considered to stand for local oscillator), respectively. For example, the first mixing switch 131 is connected to be controlled by the mixing signal $V_{LO}$ having a phase of 0 degrees, and the second mixing switch 132 is connected to be controlled by the mixing signal having a phase of 180 degrees (i.e., $-V_{LO}$). It will be understood that, dependent on the mixing signal, there may be periods of time where the RF current is divided between the first and second mixer switches 131 and 132. The first and second mixer switches 131 and 132 are configured to mix the input-current signal with the mixing signal to output a current output signal, provided at current output nodes 171 and 172. The first and second resistors 191 and 192 are configured to convert the current signals output by the first and second mixer switches, respectively, into voltage signals, to provide a voltage output signal, $V_{IF}$, between first and second output nodes 181 and 182.

In overview, mixer circuitry 100 is configured to convert the input-voltage signal $V_{RF}$ into an input-current signal, mix the input-current signal with a mixing signal $V_{LO}$ and output a voltage output signal $V_{IF}$. The voltage output signal $V_{IF}$ has a frequency (output frequency) dependent on the frequency of the input voltage signal ($V_{RF}$) (input frequency, $f_{IN}$) and the frequency of the mixing signal $V_{LO}$ (mixing frequency, $f_{MIX}$). In particular, the voltage output signal $V_{IF}$ contains components having frequencies of ($f_{IN} \pm f_{MIX}$).

Capacitance 103 represents the sum of the parasitic capacitances seen at the drain of the conversion switch 111. Capacitance 103 has a capacitance value of $C_1$ given by $$C_1 = C_{DB1} + C_{GS2} + C_{GS3} + C_{SB2} + C_{SB3}, \quad (1)$$

where $C_{DB1}$ is the drain-bulk capacitance of the conversion switch 111, $C_{GS2}$ and $C_{GS3}$ are the gate-source capacitances of the first and second mixing switches 131 and 132, respectively, and $C_{SB2}$ and $C_{SB3}$ are the source-bulk capacitances of the first and second mixing switches 131 and 132, respectively.

Figure 1B:
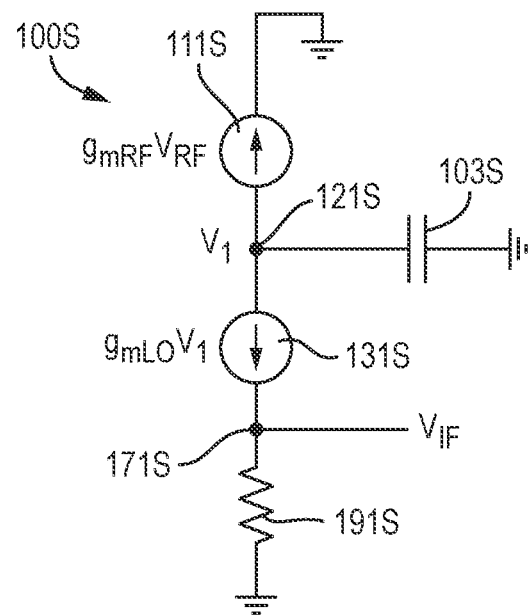
FIG. 1B is a schematic diagram useful for understanding the circuitry of FIG. 1A.

FIG. 1B is a schematic diagram useful for understanding the mixer circuitry 100 of FIG. 1A. FIG. 1B is a small signal AC model of mixer circuitry 100, referred to herein as model circuitry 100S, and the elements thereof correspond with elements of mixer circuitry 100. That is, current source 111S represents the conversion switch 111, node 121S represents the input-current node 121, current source 131S represents the first mixer switch 131, node 171S represents the current output node 171, resistor 191S represents the first resistor 191, and capacitance 103S represents the capacitance 103 (i.e. the sum of the parasitic capacitances seen at the drain of the conversion switch 111) and has the capacitance value $C_1$ in Equation 1. That is, in FIG. 1B only one "side" of the mixer circuitry 100 is considered, with the understanding that equivalent considerations apply to the other side.

According to FIG. 2, the gain of the circuit (in s-domain) can be calculated as follows:

$$G_1 = (2/\pi) \times R_L \times g_{mRF} \times g_{mLO}/(C_1 s + g_{mLO}), \quad (2)$$

where $g_{mRF}$ is the small signal transconductance of the conversion switch 111, $R_L$ is the resistance value of the resistor 191, and $g_{mLO}$ is the transconductance of each of the first and second mixing switches 131 and 132. A (2/π) factor is added to the equation because of the down-conversion gain of the first and second mixing switches 131 and 132 (which together may be referred to as the mixing stage).

Two important aspects of the mixer circuitry 100 can be concluded from Equation 2, as follows. The first is that the main pole of the circuit is:

$$\omega_p = g_{mLO}/C_1 \qquad (3)$$

Equation 3 mainly determines the maximum speed of the mixer. The second conclusion is the accuracy (linearity) of the mixer which is mainly due to two terms in Equation 2: the transconductance of the conversion switch 111, $g_{mRF}$, and the current division happening between the two conductances, $g_{mLO}$ and $C_1$ (i.e. the term $1/(C_1 s + g_{mLO})$). When the amplitude of the input-voltage signal $V_{RF}$ is increased, the quantities $g_{mRF}$ and $g_{mLO}$ both change, which creates a nonlinear behaviour which will be reflected in the $P_{1dB}$ (1-dB compression point, or P_1dB) or IP3 (third-order intercept) of the mixer.

FIG. 2 is a schematic diagram of modified mixer circuitry 200, also as a comparative example. Modified mixer circuitry 200 is an implementation of mixer circuitry 100 that has been modified to be double-balanced.

It will be appreciated that the mixer circuitry 200 receives as an input a differential input-voltage signal $V_{RF}$, and employs two arrays 231 and 232 of switches 231A/B and 232A/B to mix the differential input-voltage signal with a mixing signal $V_{LO}$ and outputs a differential voltage signal $V_{IF}$.

In detail, modified mixer circuitry 200 comprises first and second input-voltage nodes 201 and 202, first and second conversion switches 211 and 212, first and second input-current nodes 221 and 222, first and second switch arrays 231 and 232, first and second current output nodes 271 and 272, first and second resistors 291 and 292 and first and second output nodes 281 and 282. The first and second current output nodes 271 and 272, the first and second resistors 291 and 292 and the first and second output nodes 281 and 282 are configured in the same way as the corresponding elements (171, 172, 191, 192, 181 and 182, respectively) of mixer circuitry 100.

The first and second input-voltage nodes 201 and 202 are configured to receive a differential input-voltage signal, $V_{RF}$, therebetween, shown as having positive and negative components $V_{RF+}$ and $V_{RF-}$, respectively. The first switch array 231 comprises first and second switches 231A and 231B configured to receive the input-current signal from node 221 and configured to be controlled by opposite phases of a mixing signal $V_{LO}$ (in a similar way to the first and second switches 131 and 132 of mixer circuitry 100). Similarly, the second switch array 232 comprises first and second switches 232A and 232B configured to receive the input-current signal from node 222 and configured to be controlled by opposite phases of the mixing signal $V_{LO}$. In the present example, the switches 211, 212, 231A, 231B, 232A, 232B are field-effect transistors, in particular PMOS MOSFETs.

Looking at FIG. 2, it will be appreciated that each of the output nodes 271 and 272 carries a double-balanced signal in that any $V_{LO}$ linkage is balanced by $-V_{LO}$ linkage, and also any $V_{RF+}$ linkage is balanced by $V_{RF-}$ linkage. Taking output node 271 as an example, linkage from transistor 231A is balanced by linkage from transistor 232B, and linkage from transistor 211 is balanced by linkage from transistor 212.

The Equations 1-3 apply equally to modified mixer circuitry 200 as they do to mixer circuitry 100. As discussed above, the two conclusions drawn from Equation 2 (the limited speed of the mixer circuitry 100 and modified mixer circuitry 200 and the non-linearity of the mixer circuitry 100 and modified mixer circuitry 200) are disadvantageous. To overcome these disadvantages (among others), two example arrangements are disclosed herein.

FIG. 3 is a schematic diagram of a first example arrangement 300 of mixer circuitry embodying the present invention.

Mixer circuitry 300 is differential mixer circuitry and comprises first and second input-voltage nodes 301 and 302, a current source 308, passive network of impedances 310 (which may be referred to as a passive network or as a passive matching network), first and second input-current nodes 321 and 322, a first array 331 of first and second switches 331A and 331B, a second array 332 of first and second switches 332A and 332B, first and second output-current nodes 371 and 372, first and second output-voltage nodes 381 and 382 and first and second resistors 391 and 392.

The first and second input-voltage nodes 301 and 302 are configured to receive first and second input-voltage signals $V_{RF+}$ and $V_{RF-}$, respectively, the first and second input-voltage signals $V_{RF+}$ and $V_{RF-}$ defining a differential input-voltage signal $V_{RF}$ having an input frequency, $f_{IN}$. The passive network 310 is connected between the first and second input-voltage nodes 301 and 302, and between the current source 308 (which is in turn connected to a high voltage reference or supply $V_H$) and the first and second input-current nodes 321 and 322. The current source 308 is configured to control or regulate a bias current provided to the passive network 310, i.e. so that it is effectively a DC (i.e. ideally, constant) current. The passive network 310 is configured to convert the first and second input-voltage signals $V_{RF+}$ and $V_{RF-}$ into first and second input-current signals, respectively, provided at the first and second input-current nodes 321 and 322, respectively. The passive network 310 causes the first and second input-current signals to have respective AC components (defined by $V_{RF+}$ and $V_{RF-}$ respectively) and a DC component (defined by the bias current provided by the current source 308). The passive network 310 operates as a voltage-to-current conversion stage 310. The first and second input-current signals define a differential input-current signal having the input frequency $f_{IN}$.

The first and second arrays 331 and 332 can be referred to together as a mixing stage 350. The mixing stage 350 is configured to mix the differential input-current signal with a mixing signal $V_{LO}$ having a mixing frequency $f_{MIX}$, and to output a differential output signal having an output frequency four dependent on the input frequency $f_{IN}$ and the mixing frequency $f_{MIX}$. In particular, the differential output signal contains components having frequencies of $(f_{IN} \pm f_{MIX})$. Specifically, in the example illustrated in FIG. 3, the mixing stage 350 is configured to generate first and second output-current signals at the first and second output-current nodes 371 and 372, respectively, and defining the differential output signal, the differential output signal being a differential output-current signal.

The first and second switches 331A and 331B of the first array 331 are each connected to receive the first input-current signal at the first input-current node 321, and the first and second switches 332A and 332B of the second array 332 are each connected to receive the second input-current signal at the second input-current node 322, The first switches 331A and 332A are connected to be controlled by the mixing signal $V_{LO}$ having a first phase (e.g. 0 degrees) and their outputs are connected to the first and second output-current nodes 371 and 372, respectively. The second switches 331B and 332B are connected to be controlled by the mixing signal $V_{LO}$ having a second phase opposite to the first phase, e.g. 180 degrees, (which is shown in FIG. 3 by "$-V_{LO}$") and their outputs are connected to the second and first output-current nodes 372 and 371 respectively.

In order to better understand the present embodiment as well as later embodiments disclosed herein, it may be useful to note that a current signal output from the first switch 331A of the first array 331 and a current signal output from the second switch 332B of the second array 332 may be considered to have the same phase as one another. This is because the input-current signals received by those two switches 331A and 332B have opposite phases and the mixing signals controlling those two switches also have opposite phases (and because the phases of the input-current signal and the mixing signal sum at the output of each of the switches of the first and second arrays 331 and 332). The current signal output from first switch 331A of the first array 331 and the current signal output from the second switch 332B of the second array 332 are then summed at the output-current node 371. A similar explanation applies to the summing at the output-current node 372 of the current signals output from the second switch 331B of the first array 331 and the first switch 332A of the second array 332.

Using a differential input-voltage signal and a differential mixing signal, and having current paths between the mixing stage 350 and the output-current nodes 371 and 372 "crossing over" so that current signals from switches of the first array 331 are summed, respectively, with current signals from switches of the second array 332 as shown provides a double-balanced arrangement as mentioned earlier. For example, any $V_{LO}$ linkage is balanced by $-V_{LO}$ linkage, and also any $V_{RF+}$ linkage is balanced by $V_{RF-}$ linkage. Common-mode rejection is also provided by the differential signalling.

The first and second resistors 391 and 392 (as an example implementation of impedances) can be referred to together as a current-to-voltage conversion stage 390. The first and second resistors 391 and 392 are connected to the first and second current-output nodes 371 and 372, respectively, and are configured to convert the first and second output-current signals into first and second output-voltage signals provided at the first and second output-voltage nodes 381 and 382, respectively. The first and second output-voltage signals define a differential output-voltage signal having the output frequency. The differential output signal may be the differential output-current signal or the differential output-voltage signal. The first and second resistors are connected between the first and second current-output nodes 371 and 372, respectively, and a low voltage reference (or source) whose voltage level is below that of the high reference voltage $V_H$ (e.g. around GND).

The passive network 310 provides the required matching between the mixer circuitry 300 and the preceding stage (e.g. a low-noise amplifier, LNA) when implemented in other circuitry (e.g. an analogue-to-digital converter, ADC), For example, if the LNA is designed off-chip, the passive network 310 can be designed so as to provide the required characteristic impedance (e.g., 50Ω) seen from the input ports of the mixer circuitry 300 to remove reflection. Further, the passive network 310 converts voltage to current (i.e. the differential input-voltage signal to the differential input-current signal) linearly. Further still, the passive network 310 can be designed so as to provide desirable RF filtering to remove the RF image.

Figure 4:
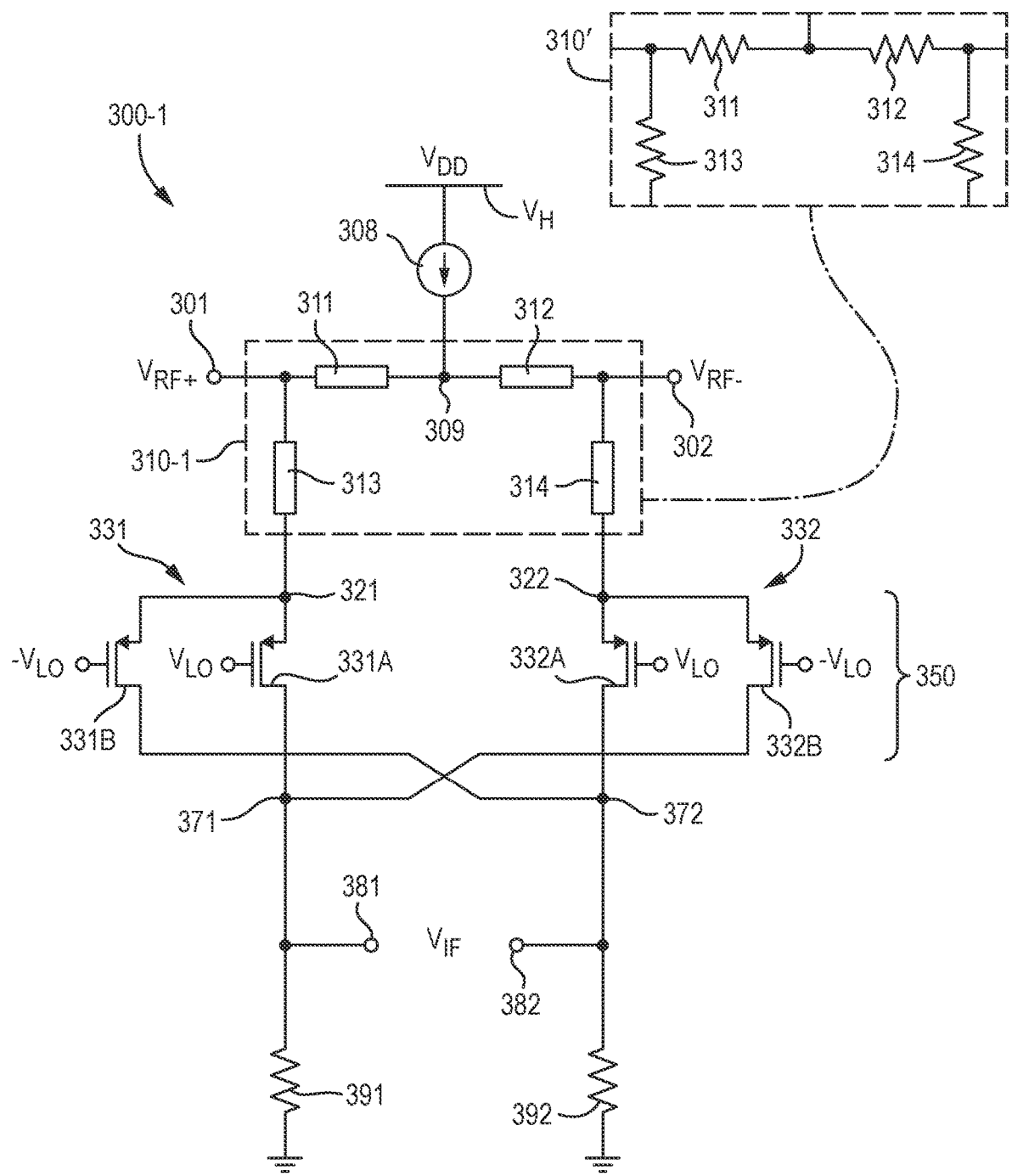
FIG. 4 is a schematic diagram of a modified first example arrangement of mixer circuitry.

FIG. 4 is a modification 300-1 of the first example arrangement 300 of mixer circuitry embodying the present invention.

The mixer circuitry 300-1 comprises a passive network 310-1 comprising impedances 311 to 314 and a tail node 309, as an implementation of the passive network 310. The other elements of the mixer circuitry 300-1 are the same as those of the mixer circuitry 300 illustrated in FIG. 3 and have the same reference numerals. Duplicate description is omitted.

With reference to the mixer circuitry 300-1, the passive network 310-1 comprises the tail node 309, first and second tail-side impedances 311 and 312 and first and second mixer-side impedances 313 and 314. The tail node 309 is connected to the current source 308 to receive current therefrom. The first tail-side impedance 311 is connected between the first input-voltage node 301 and the tail node 309, the first mixer-side impedance 313 is connected between the first input-voltage node 301 and the first input-current node 321, the second tail-side impedance 312 is connected between the second input-voltage node 302 and the tail node 309, and the second mixer-side impedance 314 is connected between the second input-voltage node 302 and the second input-current node 322.

FIG. 4 also illustrates a more specific implementation 310' of the passive network 310 in which the impedances 311 to 314 are implemented as resistors 311 to 314. In this case the passive network may be referred to as a resistive network 310'.

Figure 5:
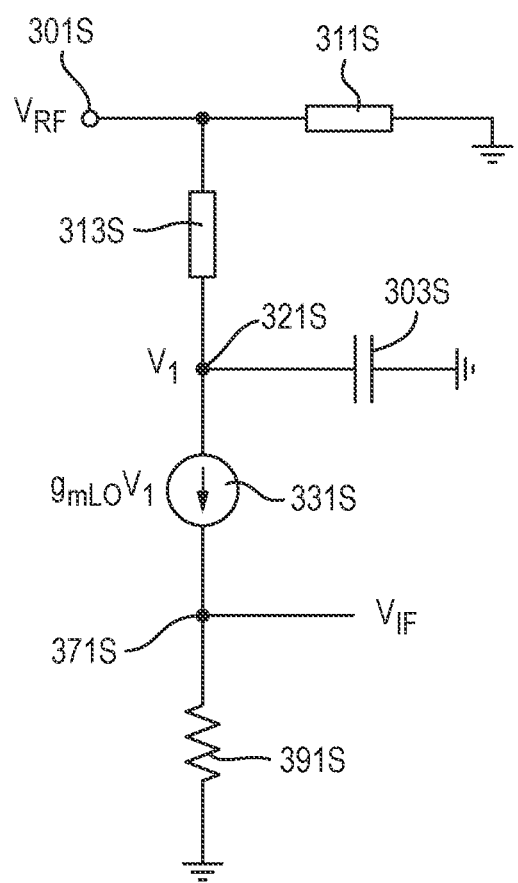
FIG. 5 is a schematic diagram useful for understanding the circuitry of FIG. 4.

FIG. 5 is a schematic diagram useful for understanding the mixer circuitry 300-1 of FIG. 4. FIG. 5 is a small signal AC model of mixer circuitry 300-1, referred to herein as model circuitry 300-1S, and the elements thereof correspond with elements of mixer circuitry 300-1. That is, the node 301S represents the first input node 301, the impedance 311S represents the first tail-side impedance 311, the impedance 313S represents the first mixer-side impedance 313, the node 321S represents the first input-current node 321, the current source 331S represents one of the switches of the first array 331 of switches, the node 371S represents the first output-current node 371, and the resistor 391S represents the first resistor 391. The capacitance 303S represents a sum of parasitic capacitances seen at the sources of the switches of the first array 331. That is, in FIG. 5 only one "side" of the mixer circuitry 300-1 is considered, with the understanding that equivalent considerations apply to the other side. That is, model circuitry 300-1S is a half-circuit model that gives the same gain results as the corresponding full circuit (i.e. mixer circuitry 300-1).

Based on FIGS. 4 and 5 it is apparent that the input impedance seen from the first input-voltage node 301 can be calculated as $$Z_{in}=(Z_1+1/g_{mLO})\|Z_2, \quad (4)$$

where $Z_1$ is the impedance value of the first mixer-side impedance 313, $Z_2$ is the impedance value of the first tail-side impedance 311, and $g_{mLO}$ is the transconductance of one of the switches of the first array 331. Of course, a similar calculation could be made for the input impedance seen from the second input-voltage node 302.

According to FIG. 5, the gain of the mixer circuitry 300-1 can be calculated as $$G_2=(2/\pi)\times R_L\times g_{mLO}\times Y_1/(g_{mLO}+sC_1+Y_1) \quad (5)$$

where $Y_1=1/Z_1$ and $C_1$ is the capacitance value of the capacitance 301S (i.e. the parasitic capacitance seen at the sources of the switches of the first array 331):

$$C_1 = C_{GS2} + C_{GS3} + C_{SB2} + C_{SB3} \quad (6)$$

where $C_{GS2}$ and $C_{GS3}$ are the gate-source capacitances of the switches 331B and 331A, respectively, and $C_{SB2}$ and $C_{SB3}$ are the source-bulk capacitances of the switches 331B and 331A, respectively.

Comparing the mixer circuitry 300-1 to the mixer circuitry 100 or 200, it will be appreciated that, since the mixer circuitry 300-1 does not comprise a "conversion switch" (e.g. conversion switch 111), the drain-bulk capacitance of the conversion switch 111 is therefore removed from the parasitic capacitance value $C_1$ which makes $C_1$ smaller.

Referring again to FIG. 4, the specific implementation 310' of the passive network 310 comprises resistors 311 to 314 as the impedances 311 to 314, and may be referred to as a resistive network 310' as mentioned above.

Assuming that the passive network 310 comprises resistors as in the resistive network 310' simplifies the following calculations. Of course, similar considerations apply (and corresponding advantages are achieved) however the impedances 311 to 314 are implemented in practice. Looking at the resistive network 310, the gain as calculated in Equation 5 can be calculated as $$G_2 = (2/\pi) \times R_L \times g_{mLO} \times g_1/(g_{mLO} + sC_1 + g_1) \quad (7)$$

where $g_1=1/R_1$ and $R_1$ is the resistance value of either of the first and second mixer-side resistances assuming the circuit is balanced. Similarly to Equation 3, the main pole of the mixer circuitry 300-1 can be calculated as:

$$\omega_p = (g_{mLO} + g_1)/C_1 \quad (8)$$

Comparing Equation 8 with Equation 3, it will be appreciated that the dominant pole of the mixer circuitry 300-1 is increased by a factor of $(1+g_1/g_{mLO})$. This means that the passive network can be designed such that higher bandwidth is achieved compared to the mixer circuitry 100 or 200 (effectively, the mixer circuitry 300-1 is faster than mixer circuitry 100 or 200). It will be appreciated that similar considerations apply to the mixer circuitry 300 since, compared to the mixer circuitry 100 or 200, there is no "conversion switch" (i.e. conversion switch 111), and instead a passive network is used for the voltage-to-current conversion.

Figure 6:
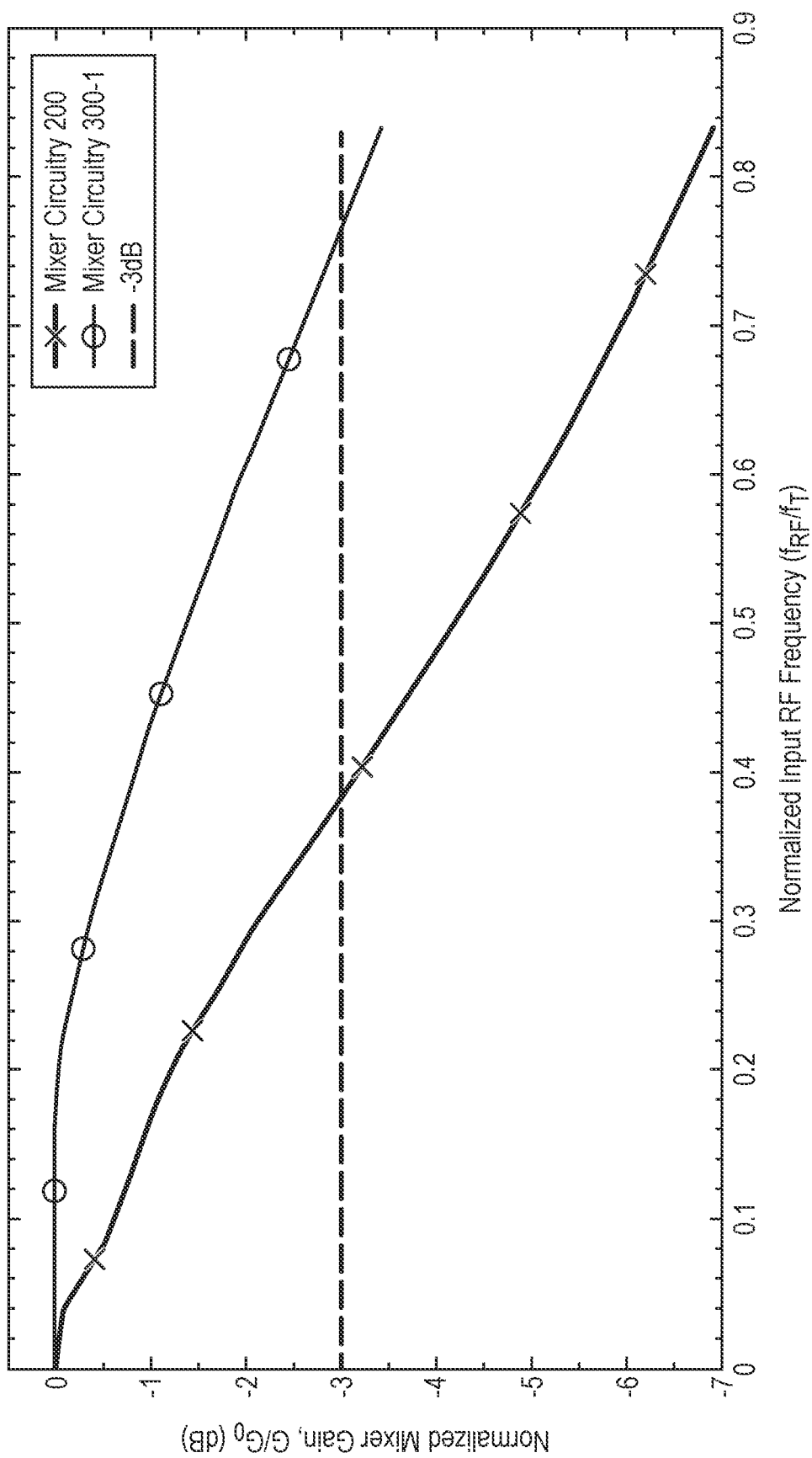
FIG. 6 is a graph useful for understanding the circuitry of FIGS. 3 and 4.

FIG. 6 is a graph useful for understanding the mixer circuitry 300 and 300-1. The graph in FIG. 6 shows the normalized gain of the mixer circuitry 200 and of the mixer circuitry 300-1 (with the resistive network 310') against normalized input frequency (which is RF in this case). A simulation was carried out to obtain the graph in FIG. 6, implemented in a 16-nm FinFet technology. In this example simulation, the mixer circuitry 300-1 (with the resistive network 310) was compared against the mixer circuitry 200 with the same power budget, device area, mixing gain, output low pass filter (i.e., a capacitor in parallel to each of the load resistors 291, 292, 391 and 392) and test bench condition. In this example simulation, a single tone with the input frequency of $f_{RF}$ was applied as the input-voltage signal $V_{RF}$ and the mixing frequency of the mixing signal $V_{LO}$ was set at $f_{LO}$ such that: $f_{LO}=f_{RF}+100$ MHz. The 100 MHz tone amplitude was detected at the output of each of the mixer circuitry 200 and the mixer circuitry 300-1. FIG. 6 shows the normalized mixer gain $G/G_0$ with respect to the normalized input frequency $f_{RF}/f_T$ for the mixer circuitry 200 (shown by the curve with crosses) and the mixer circuitry 300-1 (shown by the curve with circles). The normalized input frequency has been generated by normalizing the input frequency $f_{RF}$ to $f_T$, the cut-off frequency of the switches of the first and second arrays 331 and 332 and the two arrays 231 and 232. The normalized mixer gain has been generated by normalizing the mixer gain G to $G_0$, i.e. the mixer gain at DC. As can be seen, the bandwidth (i.e. the input frequency corresponding to a normalized gain of −3 dB) of the mixer circuitry 200 is around 0.38 $f_T$ where $f_T$ is the cut-off frequency as defined above. The bandwidth (the input frequency corresponding to a normalized gain of −3 dB) for the mixer circuitry 300-1 is around 0.76 $f_T$, which is significantly higher than that of the mixer circuitry 200.

In the example simulations generating the graph in FIG. 6, the resistance values and the transconductance values were as follows: $R_1=40\Omega$, $R_2=150\Omega$, where $R_1$ is the resistance value of each of the mixer-side resistors 313 and 314 and $R_2$ is the resistance value of each of the tail-side resistors 311 and 312, and $1/g_{mLO}=35\Omega$. According to Equation 8, the bandwidth of the mixer circuitry 300-1 compared to that of the mixer circuitry 200 should be enhanced by the factor of $(1+35/40)=1.875$. This is nearly consistent with the amount of bandwidth improvement shown by the graph in FIG. 6.

One source of the nonlinearity in the mixer circuitry 100 and 200 is the transcoductance of the conversion switch(es) 111 (and 121), i.e., $g_{mRF}$, which act(s) as the V/I converter. Ignoring the frequency response of the mixing stage 350, calculating the change in gain of the mixer circuitry 100 or 200 based on the change in the transconductance of the conversion switch 111 or 121 using Equation 2 results in:

$$\Delta G_1 = (2/\pi) \times R_L \times \Delta g_{mRF} \quad (9)$$

Normalizing the change in mixer gain to the mixer gain:

$$\Delta G_1/G_1 = \Delta g_{mRF}/g_{mRF} \quad (10)$$

Considering the mixer circuitry 300-1 (with the resistive network 310') and ignoring the high frequency response, the variation in the gain of the mixer circuitry 300-1 can be calculated according to Equation 7:

$$\Delta G_2/G_2 = \Delta g_{mLO}/(G_{mLO} \times (1+g_{mLO}/g_1)) \quad (11)$$

Assuming that the large signal variations of the transconductances of the conversion switches in the mixer circuitry 100 and 200 and of the switches of the first and second arrays 331 and 332 of the mixer circuitry 300-1 are around the same level, i.e. that:

$$\Delta g_{mLO} \sim \Delta g_{mRF}, \quad (12)$$

then the comparison of the gain variations in (10) and (11) results in $$(\Delta G_2/G_2)/(\Delta G_1/G_1) = 1/(1+g_{mLO}/g_1) \quad (13)$$

That is, the gain variations in the mixer circuitry 300-1 are smaller than those in the mixer circuitry 100 and 200. This means that the mixer circuitry 300-1 (and therefore the mixer circuitry 300 because of the absence of the conversion switch 111/211/212) shows better large signal behaviour (in terms of linearity, P_1dB, and IP3) compared to the mixer circuitry 100 and 200.

Figure 7:
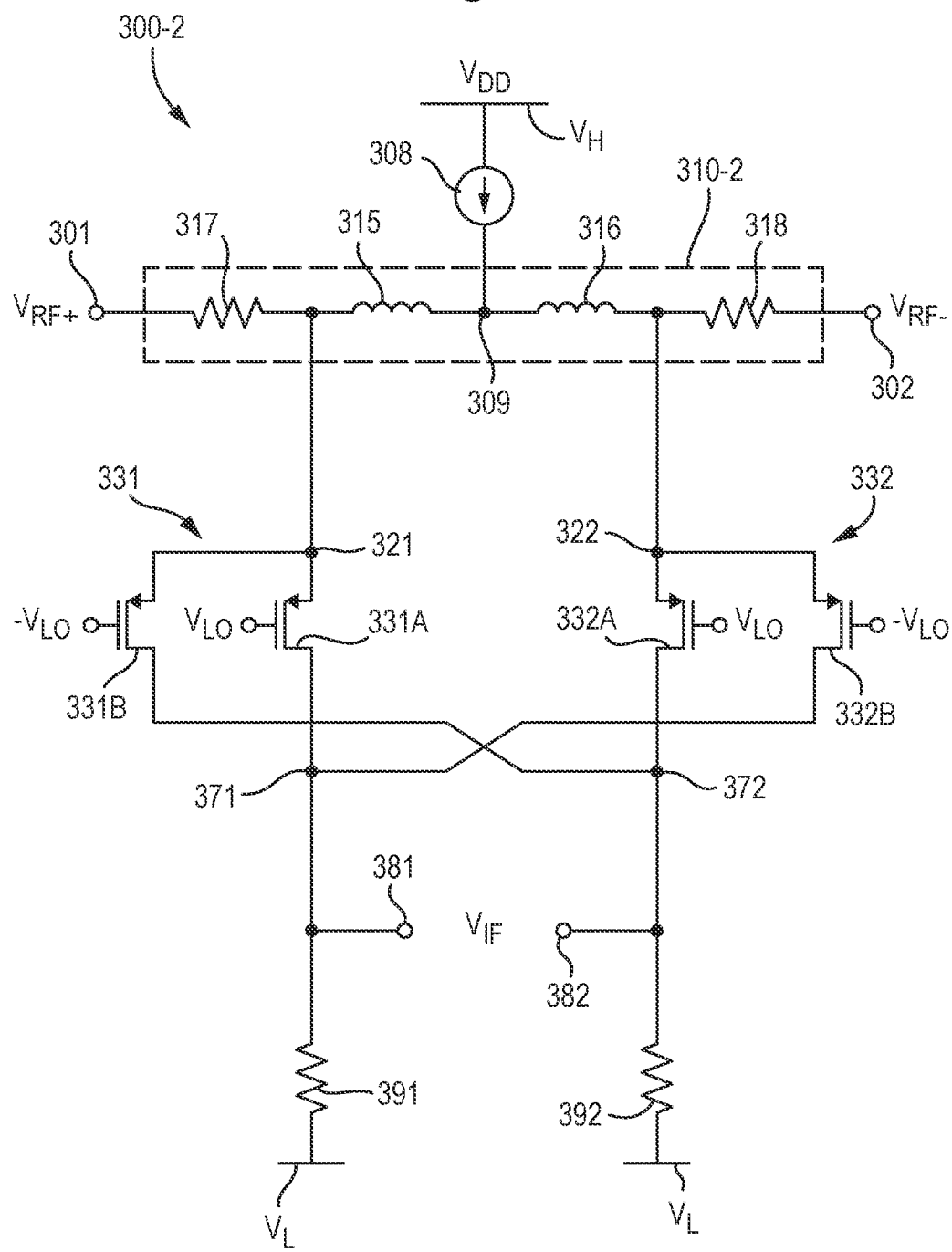
FIG. 7 is a schematic diagram of another modified first example arrangement of mixer circuitry.

FIG. 7 is a schematic diagram of another modification 300-2 of the first example arrangement of mixer circuitry embodying the present invention.

The mixer circuitry 300-2 comprises a passive network 310-2, comprising impedances 315 to 318 and a tail node 309, as an implementation of the passive network 310. The other elements of the mixer circuitry 300-2 are the same as those of the mixer circuitry 300 illustrated in FIG. 3 and have the same reference numerals. Duplicate description is omitted.

With reference to the mixer circuitry 300-2, the passive network 310-2 comprises the tail node 309, first and second tail-side impedances 315 and 316 and first and second input-side impedances 317 and 318. The first tail-side impedance 315 is connected between the first input-current node 321 and the tail node 309, the first input-side impedance 317 is connected between the first input-current node 321 and the first input-voltage node 301, the second tail-side impedance 316 is connected between the second input-current node 322 and the tail node 309, and the second input-side impedance 318 is connected between the second input-current node 322 and the second input-voltage node 302. The first and second tail-side impedances 315 and 316 are implemented as inductors and the first and second input-side 317 and 318 impedances are implemented as resistors. This is not essential.

Figure 8A:
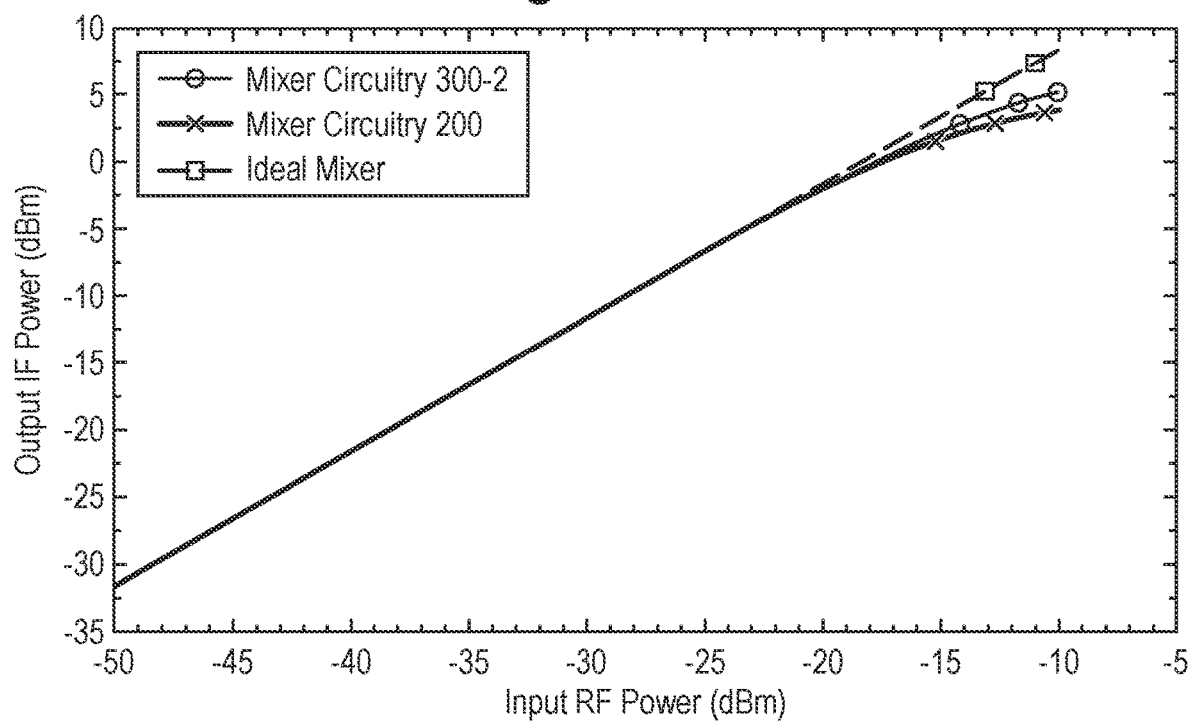
FIGS. 8A and 8B are graphs useful for understanding the circuitry of FIGS. 3, 4 and 7.
Figure 8B:
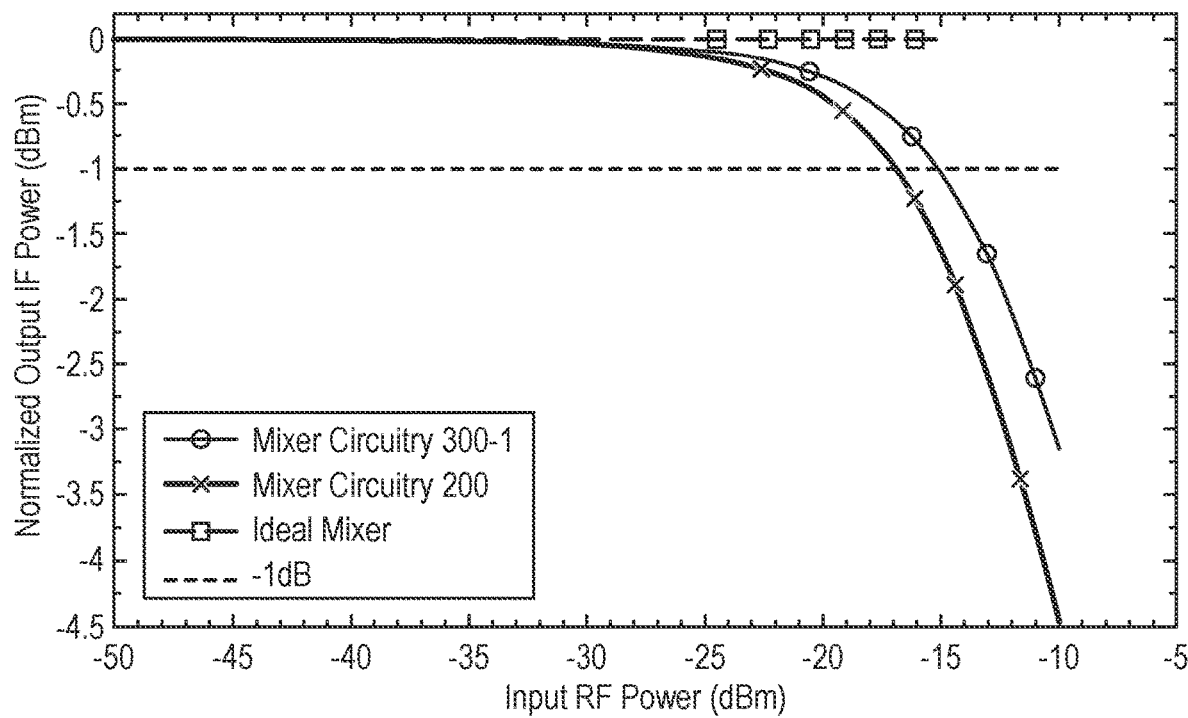

FIGS. 8A and 8B are graphs useful for understanding the mixer circuitry 300, 300-1 and 300-2. A simulation was carried out to obtain the graphs in FIGS. 8A and 8B, the simulation having the same set-up as the simulation carried out to obtain the graph in FIG. 6, except using the mixer circuitry 300-2 and the mixer circuitry 200 and comparing the two. Further, the following example design parameters were used in the simulation: VDD=0.9 V, $f_{RF}$=39.9 GHz, $f_{LO}$=40 GHz. Also, the input RF amplitude (the amplitude of the input-voltage signal $V_{RF}$) was swept from −50 dBm to −10 dBm.

The graph in FIG. 8A shows the output IF power of the detected tone (i.e. the output power of the output-voltage signal $V_{IF}$) in dBm with respect to the input RF power (i.e. the power of the input-voltage signal $V_{RF}$) in dBm for the mixer circuitry 200 (shown by the curve with crosses), the mixer circuitry 300-2 (shown by the curve with circles) and an ideal mixer (shown by the curve with squares). The graph in FIG. 8B shows the normalized values of the output IF power (i.e. the output power of the output-voltage signal $V_{IF}$ normalised to the output IF power of the ideal mixer) with respect to input RF power (i.e. the power of the input-voltage signal $V_{RF}$) in dBm for the mixer circuitry 200 (shown by the curve with crosses), the mixer circuitry 300-2 (shown by the curve with circles) and an ideal mixer (shown by the curve with squares).

According to the results shown in FIGS. 8A and 8B, the mixer circuitry 200 shows a 1 dB compression point, $P_{1dB}$=−16.9 dBm while the mixer circuitry 300-2 shows a 1 dB compression point, $P_{1dB}$=−15.1 dBm which is around 1.8 dB higher than that of the mixer circuitry 200. Therefore the linearity is improved in the mixer circuitry 300-2 compared to the mixer circuitry 200 (and the same considerations apply to mixer circuitry 300 and 300-1 as to 300-2). In this design example, the mixing conversion gain is around 18.4 dB.

Figure 9:
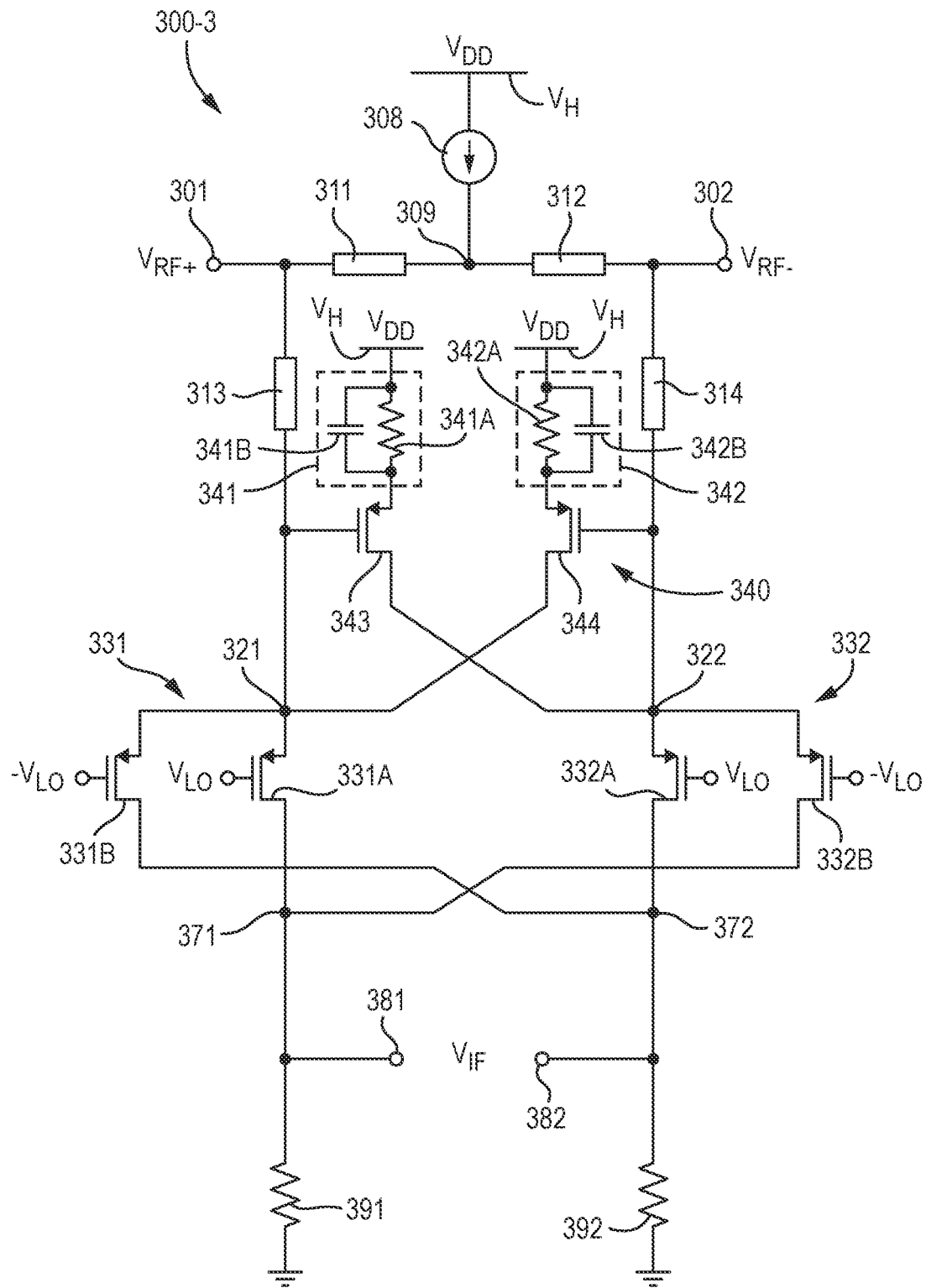
FIG. 9 is a schematic diagram of another modified first example arrangement of mixer circuitry.

FIG. 9 is a schematic diagram of another modification 300-3 of the first example arrangement of mixer circuitry embodying the present invention.

Mixer circuitry 300-3 comprises a boosting (gain boosting) network 340. The other elements of the mixer circuitry 300-3 are the same as those of the mixer circuitry 300-1 illustrated in FIG. 4 and have the same reference numerals. Duplicate description is omitted. Of course, the boosting network 340 could be similarly included in any of the mixer circuitry 300, 300-1 and 300-2.

With reference to the mixer circuitry 300-2, the boosting network (or circuitry) 340 comprises first and second auxiliary transistors 343 and 344 and first and second auxiliary impedances 341 and 342. In the present example, the first and second auxiliary transistors 343 and 344 are field-effect transistors, in particular PMOS MOSFETs.

The first auxiliary transistor 343 is connected between a first auxiliary power supply (i.e. to a high voltage reference or source which could be same as the high voltage reference or source $V_H$) and the second input-current node 322. The second auxiliary transistor 344 is connected between a second auxiliary power supply (i.e. to a high voltage reference or source which could be same as the high voltage reference or source $V_H$ and/or the same as the first auxiliary power supply) and the first input-current node 321.

The first and second auxiliary transistors 343 and 344 are connected to the first and second auxiliary power supplies via the first and second auxiliary impedances 341 and 342, respectively. The first auxiliary impedance 341 comprises a resistor 341A and a capacitance 341B connected together in parallel between the first auxiliary power supply and the first auxiliary transistor 343. The second auxiliary impedance 342 comprises a resistor 342A and a capacitance 342B connected together in parallel between the second auxiliary power supply and the second auxiliary transistor 344. The gate terminals of the first and second auxiliary transistors 343 and 344 are connected to the first and second input-current nodes 321 and 322, respectively, so that the first and second auxiliary transistors 343 and 344 are controlled by the first and second input-current signals, respectively.

The operation of the boosting network 340 is as follows. When the amplitude of the input signal $V_{RF}$ goes high, the current through the first mixer-side impedance 313 increases while the current though the second mixer-side impedance 314 decreases. In this case, the gate voltage of the first auxiliary transistor 343 increases and the gate voltage of the second auxiliary transistor 344 decreases. This results in more current flowing through the second auxiliary transistor 344 and less current flowing through the first auxiliary transistor 343. Corresponding considerations apply when the amplitude of the input signal $V_{RF}$ goes low. This action boosts the amount of RF current (i.e. the amplitude of the input-current signals) passing through the switches of the mixing stage 350 and thus increases the conversion gain of the mixer circuitry 300-3. The resistors 341A and 342A are included to linearize the first and second auxiliary transistors 343 and 344 and also to limit the DC bias current of the auxiliary circuit while the input stage is in equilibrium state (i.e. when $V_{RF+}$=$V_{RF-}$). The resistors 341A and 342A are practically shunted out by the capacitances 341B and 342B at the RF frequency to increase the AC gain of the boosting network 340. This gives a good AC/DC performance ratio for the whole mixer circuitry 300-3.

Figure 10:
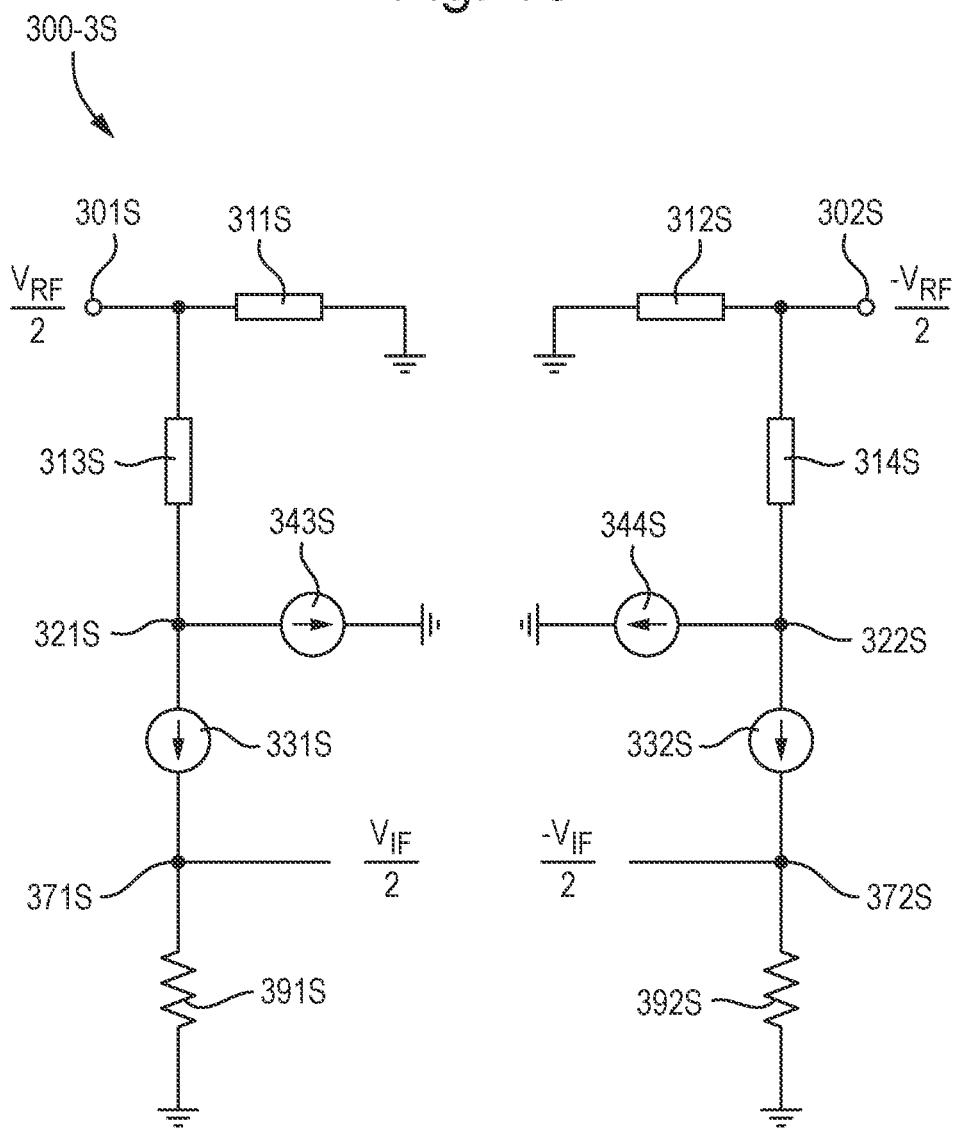
FIG. 10 is a schematic diagram useful for understanding the circuitry of FIG. 9.

FIG. 10 is a schematic diagram useful for understanding the mixer circuitry 300-3 of FIG. 9. FIG. 10 is a small signal AC model of mixer circuitry 300-3, referred to herein as model circuitry 300-3S, and the elements thereof correspond with elements of mixer circuitry 300-3. Similarly to previous examples of small signal AC models disclosed herein, elements of model circuitry 300-3S corresponding to elements of the mixer circuitry 300-3 have the same reference numerals as those elements of mixer circuitry 300-3 but with an "S" affixed to the end thereof. For example, the nodes 301S and 302S represent the first and second input node 301 and 302, respectively. The correspondence between the other elements of model circuitry 300-3S and mixer circuitry 300-3 will be understood accordingly. Further, it is noted that in the model circuitry 300-3S, the intrinsic and parasitic capacitances of the auxiliary transistors 343 and 344 and the switches of the mixing stage 350 are ignored (i.e. for calculation of the low frequency gain). Further, it is assumed that the resistors 341A and 342A are totally shunted out by the capacitances 341B and 342B.

Bearing in mind the above, according to the model circuitry 300-3S, the gain of the mixer circuitry 300-3 can be calculated as:

$$G_3 = (2/\pi) \times R_L \times g_{mLO} \times Y_1/(g_{mLO} + Y_1 - g_{mA1,2}), \quad (14)$$

where $g_{mA1,2}$ is the transconductance of each of the first and second auxiliary transistors 343 and 344 and the other quantities have the same meanings as in previous Equations.

Comparing Equation 14 with Equation 5 at low frequencies (i.e. so that s~0) results in:

$$G_3 > G_2 \quad (15)$$

That is, the gain of the mixer circuitry 300-3 is higher than that of the mixer circuitry 300-1. As mentioned above, it will be appreciated that the addition of the boosting network 340 is not limited to the mixer circuitry 300-1. The boosting network can be added to any of mixer circuitry 300, 300-1 and 300-2.

Further, the boosting network 340 could be added between the mixing stage 350 and the current-to-voltage conversion stage 390 instead of or in addition to adding the boosting network 340 between the passive network 310 and the mixing stage 350.

Figure 11:
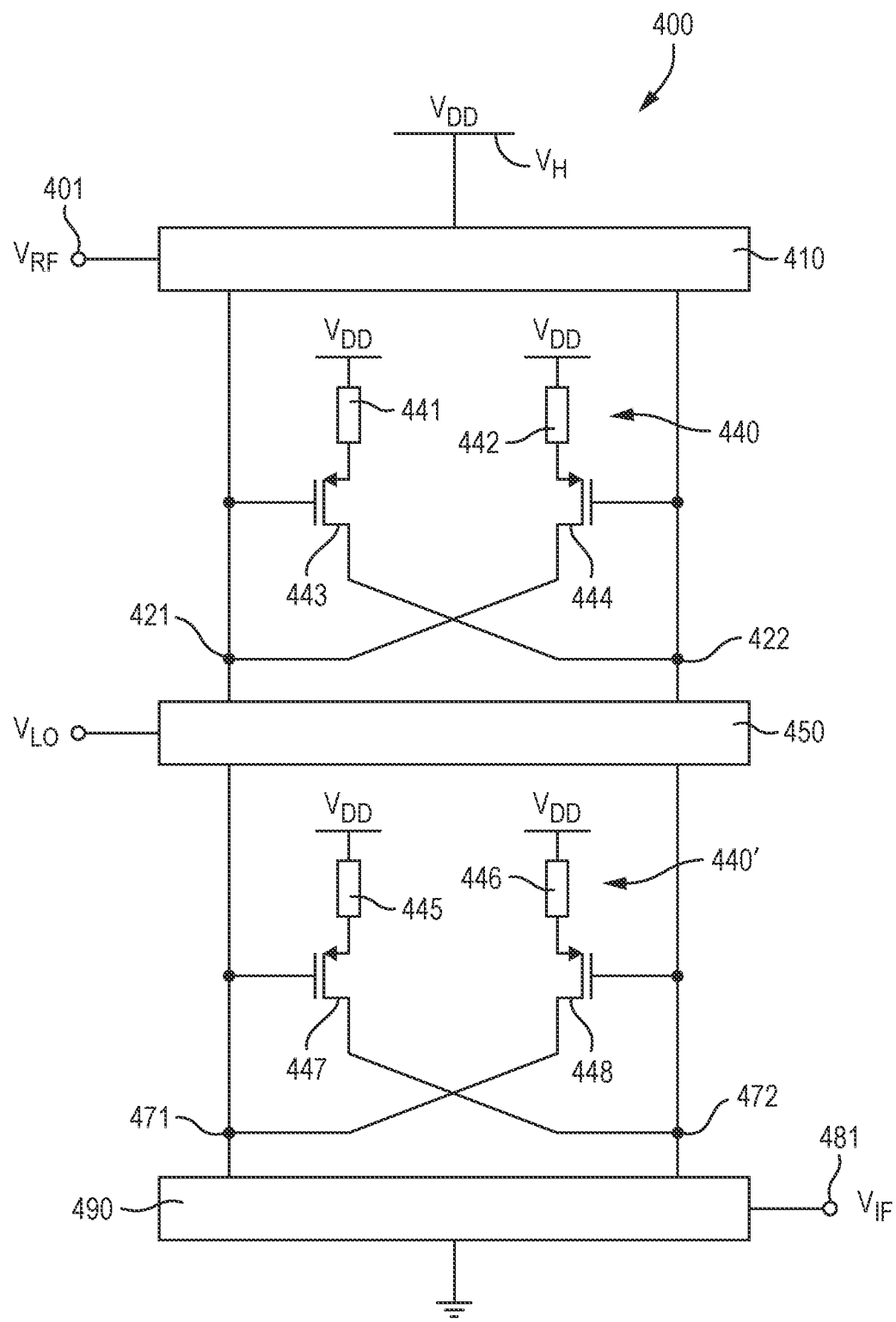
FIG. 11 is a schematic diagram of another modified first example arrangement of mixer circuitry.

FIG. 11 is a schematic diagram of another modification 400 of the first example arrangement of mixer circuitry embodying the present invention.

Mixer circuitry 400 comprises a voltage-to-current conversion stage 410 (i.e. a passive/resistive network), a mixing stage 450, a current-to-voltage stage 490, a first boosting network 440 connected between the voltage-to-current conversion stage 410 and the mixing stage 450, and a second boosting network 440' connected between the mixing stage 450 and the current-to-voltage stage 490. The voltage-to-current conversion stage 410, the mixing stage 450 and the current-to-voltage stage 490 may correspond to those stages of the mixer circuitry 300, 300-1 or 300-2. Further, the first boosting network 440 corresponds to the boosting network 340 illustrated in FIG. 9 and its elements have been given the same reference signs but starting at 400 instead of 300. The connections of the first boosting network 440 to the mixer circuitry 400 are the same as those of the boosting network 340 to the mixer circuitry 300-3.

The second boosting network 440' comprises third and fourth auxiliary transistors 447 and 448 and third and fourth auxiliary impedances 445 and 446. The third auxiliary transistor 447 is connected between a third auxiliary power supply (i.e. to a high voltage reference or source which could be same as the high voltage reference $V_H$ and/or the same as either of the first and second auxiliary power supplies) and the second output-current node 472. The fourth auxiliary transistor 448 is connected between a fourth auxiliary power supply (i.e. to a high voltage reference or source which could be same as the high voltage reference $V_H$ and/or the same as the third auxiliary power supply and/or the same as either of the first and second auxiliary power supplies) and the first output-current node 471. In the present example, the third and fourth auxiliary transistors 447 and 448 are field-effect transistors, in particular PMOS MOSFETs.

The third and fourth auxiliary transistors 447 and 448 are connected to the third and fourth auxiliary power supplies via the third and fourth auxiliary impedances 445 and 446, respectively. Though not shown, the third auxiliary impedance 445 comprises a resistor 445A and a capacitance 445B connected together in parallel between the third auxiliary power supply and the third auxiliary transistor 447, and the fourth auxiliary impedance 446 comprises a resistor 446A and a capacitance 446B connected together in parallel between the fourth auxiliary power supply and the fourth auxiliary transistor 448. The gate terminals of the third and fourth auxiliary transistors 447 and 448 are connected to the first and second output-current nodes 471 and 472, respectively, so that the third and fourth auxiliary transistors 447 and 448 are controlled by the first and second output-current signals, respectively. Of course, including two such boosting networks 440 and 440' in mixer circuitry (e.g. 300) will result in higher gain (in particular, at high frequencies) which may be desirable.

It is noted that the gain of mixer circuitry (e.g. 300) can be boosted by using a higher resistance value for the resistors 391 and 392, but this boosting is limited by the voltage headroom and imposes an extra voltage headroom limitation to the stack (the set of components of the mixer circuitry (e.g. 300) connected between the higher and lower voltage reference sources. In terms of input-referred noise (i.e. noise in the input-voltage signal $V_{IN}$, it is better to increase the gain near the RF front-end (i.e. near the input-voltage nodes) rather than the IF (or baseband) back-end (i.e. near the output-current or output-voltage nodes). This can be accomplished by including first and second boosting networks 440 and 440' as described above and shown in FIG. 11. Including two such boosting networks 440 and 440' in mixer circuitry (e.g. 300) gives a distributed gain boosting capability to the mixer circuitry (e.g. 300) without imposing extra voltage headroom limitation to the stack (which is the case if gain is boosted using a higher resistance value for the resistors 391 and 392).

Figure 12:
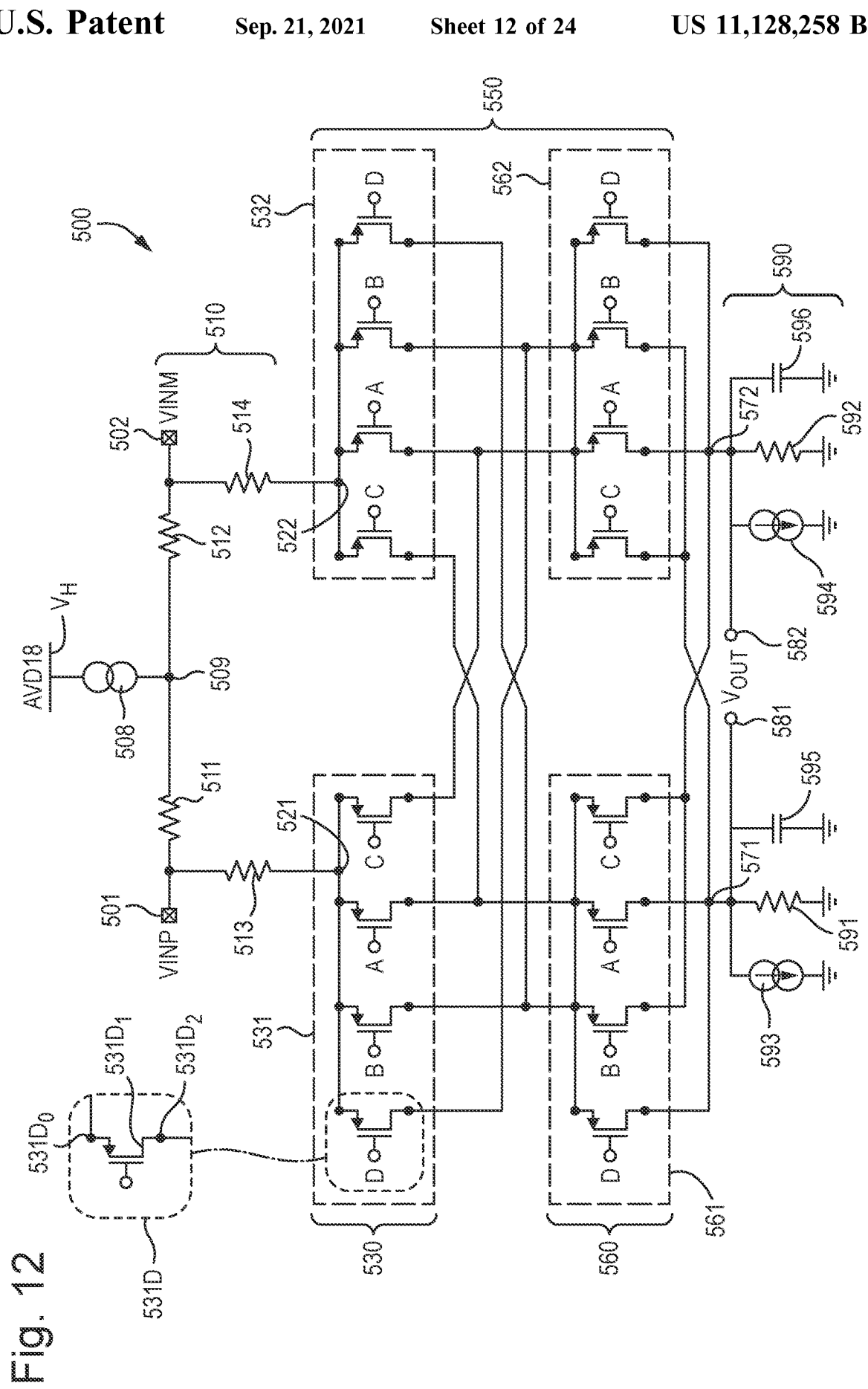
FIG. 12 is a schematic diagram of a second example arrangement of mixer circuitry.

FIG. 12 is a schematic diagram of a second example arrangement 500 of mixer circuitry embodying the present invention. The following description of the operation of the mixer circuitry 500 is according to a first (or given) operation mode.

Mixer circuitry 500 is differential mixer circuitry and comprises first and second input-current nodes 521 and 522, a mixing stage 550, and first and second output-current nodes 571 and 572. The mixing stage 550 comprises first and second mixer sub-stages 530 and 560. The first mixer sub-stage 530 comprises first and second arrays 531 and 532 each comprising X switches, X upstream nodes and X downstream nodes. In particular, the first and second arrays 531 and 532 each comprise four switches, four upstream nodes and four downstream nodes (i.e. X=4). The second mixer sub-stage 560 comprises first and second arrays 561 and 562 each comprising Y switches, Y upstream nodes and Y downstream nodes. In particular, the first and second arrays 561 and 562 each comprise four switches, four upstream nodes and four downstream nodes (i.e. Y=4). In the present example, the switches of the mixing stage 550 are field-effect transistors, in particular PMOS MOSFETs (and similar considerations apply to the other mixing stages shown herein).

The switches of the first mixer sub-stage 530 are connected to be controlled by respective phases of a first sub-stage mixing signal. The switches of the first array 531 are connected to be controlled by phases A, B, C and D, respectively, of the first sub-stage mixing signal and the switches of the second array 532 are also connected to be controlled by the phases A, B, C and D, respectively, of the first sub-stage mixing signal. The signals having the four phases A, B, C and D and corresponding to the first sub-stage mixing signal are time-interleaved clock signals.

Similarly, the switches of the second mixer sub-stage 560 are connected to be controlled by respective phases of a second sub-stage mixing signal. The switches of the first array 561 are connected to be controlled by phases A, B, C and D, respectively, of the second sub-stage mixing signal and the switches of the second array 562 are also connected to be controlled by the phases A, B, C and D, respectively, of the second sub-stage mixing signal. The signals having the four phases A, B, C and D and corresponding to the second sub-stage mixing signal are time-interleaved clock signals. The phase of the signal controlling each switch of the mixing stage 550 is indicated by a letter, A, B, C or D beside each switch (at its gate).

The switches of each array 531 and 532 are connected to (or between) the upstream and downstream nodes, respectively, of that array along respective current paths. Similarly, the switches of each array 561 and 562 are connected to the upstream and downstream nodes, respectively, of that array along respective current paths.

The switches (i.e. the channels of the respective transistors) form parts of their respective current paths. A current path 531D is shown in more detail in FIG. 12. Current path 531D comprises switch $531D_1$ connected between upstream node $531D_0$ and downstream node $531D_2$, so that the source terminal of switch $531D_1$ is connected to upstream node $531D_0$ and the drain terminal of switch $531D_1$ is connected to downstream node $531D_2$. The switch $531D_1$ is connected to be controlled (at its gate terminal) by phase D of the first sub-stage mixing signal.

The other switches, upstream nodes, and downstream nodes have corresponding reference signs, but the reference signs have not been included to avoid over-complicating FIG. 12. For example, switch $531B_1$ (the switch of the first array 531 with the letter B next to its gate terminal) is connected between upstream node $531B_0$ and downstream node $531B_2$ along current path 531B, and is connected to be controlled by phase B of the first sub-stage mixing signal. Further, switch $532C_1$ (the switch of the second array 532 with the letter C next to its gate terminal) is connected between upstream node $532C_0$ and downstream node $532C_2$ along current path 532C, and is connected to be controlled by phase C of the first sub-stage mixing signal. Further, switch $561A_1$ (the switch of the first array 561 of the second mixer sub-stage 560 with the letter A next to its gate terminal) is connected between upstream node $561A_0$ and downstream node $561A_2$ along current path 561A, and is connected to be controlled by phase A of the second sub-stage mixing signal. Further, switch $562B_1$ (the switch of the second array 562 of the second mixer sub-stage 560 with the letter B next to its gate terminal) is connected between upstream node $562B_0$ and downstream node $562B_2$ along current path 562B, and is connected to be controlled by phase B of the second sub-stage mixing signal. The other switches of the mixing stage 550 are similarly connected to their respective upstream and downstream nodes and duplicate description is omitted.

The first and second input-current nodes 521 and 522 are configured to receive first and second input-current signals, respectively, the first and second input-current signals defining a differential input-current signal having an input frequency. The first mixer sub-stage 530 is configured to mix the differential input-current signal with the first sub-stage mixing signal. The first sub-stage mixing signal has a first mixing frequency. The second mixer sub-stage 560 is configured to mix the output of the first mixer sub-stage 530 with the second sub-stage mixing signal and output a differential output-current signal. The second sub-stage mixing signal has a second mixing frequency.

The differential output-current signal accordingly has an output frequency dependent on the input frequency and the first and second mixing frequencies. As mentioned in the description of the first example arrangement of mixer circuitry and the modifications thereof, when two signals are frequency mixed the resulting signal contains components having different frequencies. It will be appreciated that the output frequency in the mixer circuitry 500 can have a number of components, in fact any of $f_{OUT}=(f_{IN}\pm f_1 \pm f_2)$, where $f_{OUT}$ is the output frequency, $f_{IN}$ is the input frequency and $f_1$ and $f_2$ are the first and second mixing frequencies, respectively (and others, e.g. harmonics). Of course, various methods/techniques (e.g. suitable filtering) may be used so that only one or some of these components is obtained as the output-current signal, for example $f_{IN}-f_1-f_2$. In a particular example for context, $f_{IN}$=40 GHz (i.e. RF), $f_1$=32 GHz (i.e. RF). $f_2$=8 GHz (i.e. IF), so that a baseband frequency (centered around DC. i.e. 0 Hz) can be obtained as the output frequency.

Mixer circuitry 500 further comprises a current-to-voltage conversion stage 590 and first and second output-voltage nodes 581 and 582. The first and second output-voltage nodes 581 and 582 are configured to output first and second output-voltage signals defining a differential output-voltage signal, the differential output-voltage signal having the output frequency and corresponding to the differential output-current signal. The current-to-voltage conversion stage 590 comprises first and second resistors 591 and 592 connected between the first and second output-current nodes 571 and 572, respectively, and a low voltage reference or source (e.g. ground GND) whose voltage level is below that of the high voltage reference or source $V_H$, first and second current sources 593 and 594 connected between the first and second output-current nodes 571 and 572, respectively, and a low voltage reference or source (e.g. ground GND), and first and second capacitances 595 and 596 connected between the first and second output-current nodes 571 and 572, respectively, and a low voltage reference or source (e.g. ground GNC).

The current-to-voltage conversion stage 590 may comprise only the first and second resistors 591 and 592. The first and second capacitances 595 and 596 are used to filter out the high frequency noise and mixed or mixer interferences from the output-voltage signal (i.e. to filter out unwanted frequency components). The first and second current sources 593 and 594 are used to shift down the output common mode voltage. This provides enough drain-source voltage headroom over the switches of the second mixer sub-stage 560 (as these switches operate in the saturation region).

Mixer circuitry 500 further comprises a voltage-to-current conversion stage 510 and first and second input-voltage nodes 501 and 502. The first and second input-voltage nodes 501 and 502 are configured to receive first and second input-voltage signals VINP and VINM, respectively, the first and second input-voltage signals VINP and VINM defining a differential input-voltage signal having the input frequency. The voltage-to-current conversion stage 510 is configured to convert the first and second input-voltage signals VINP and VINM into the first and second input-current signals provided at the first and second input-current nodes 521 and 522. The voltage-to-current conversion stage 510 is the same as the passive (resistive) network 310' of mixer circuitry 300-1 and duplicate description is omitted. Of course, any of the passive networks disclosed herein could be used, and also any other circuitry for converting the first and second input-voltage signals VINP and VINM into the first and second input-current signals could be used. Further, the mixer circuitry 500 could operate based on a differential input-current signal and therefore the voltage-to-current conversion stage 510 may not be included in some implementations of the mixer circuitry 500.

The four phases of the first sub-stage mixing signal are in quadrature. For example, the phases of the four phases A, B, C and D of the first sub-stage mixing signal are, respectively, 0, 90, 180 and 270 degrees. Similarly, the four phases of the second sub-stage mixing signal are in quadrature. For example, the phases of the four phases A, B, C and D of the second sub-stage mixing signal are, respectively, 0, 90, 180 and 270 degrees. It will be appreciated that other phases are possible in theory (for example A, B, C and D could be, respectively, 5, 95, 185 and 275 degrees, respectively).

The downstream nodes of the first and second arrays 531 and 532 of the first mixer sub-stage 530 are connected to the output-current nodes 571 and 572 along current paths arranged to pass via the switches of the arrays 561 and 562 of the second mixer sub-stage 560 so that the first and second output-current signals are provided at the first and second output-current nodes 571 and 572, respectively. In particular, between the first and second mixer sub-stages 530 and 560, and between the second mixer sub-stage 560 and the output-current nodes 571 and 572, current paths carrying signals having like phases are summed together to provide the first and second output current signals at the first and second output-current nodes 571 and 572, respectively.

For example, considering the current path 531D, the phase of the current signal output at the downstream node $531D_2$ will be 270 degrees (phase of the first input-current signal (0 degrees)+phase D of the first sub-stage mixing signal (270 degrees), because the current signal at the upstream node $531D_0$ is rotated by 270 degrees by the switch $531D_1$). Considering the current path 532B, the phase of the current signal output at the downstream node $532B_2$ will be 270 degrees (phase of the second input-current signal (180 degrees)+phase B of the first sub-stage mixing signal (90 degrees)). The two current signals output at downstream nodes $531D_2$ and $532B_2$ thus have the same phase (270 degrees), and the current paths carrying these signals are summed together between the first and second mixer sub-stages 530 and 560 as shown in FIG. 12.

As another example, considering the current path 532C, the phase of the current signal output at the downstream node $532C_2$ will be 0 degrees (phase of the second input-current signal (180 degrees)+phase C of the first sub-stage mixing signal (180 degrees)). Considering the current path 531A, the phase of the current signal output at the downstream node $531A_2$ will be 0 degrees (phase of the first input-current signal (0 degrees)+phase A of the first sub-stage mixing signal (0 degrees)). The two current signals output at downstream nodes $532C_2$ and $531A_2$ thus have the same phase (0 degrees), and the current paths carrying these signals are summed together between the first and second mixer sub-stages 530 and 560 as shown in FIG. 12.

As a further example, considering the current path 561A, the phase of the current signal output at the downstream node $561A_2$ will be 0 degrees (phase of the current signals output from downstream nodes $531A_2$ and $532C_2$ (0 degrees as described above)+phase A of the second sub-stage mixing signal (0 degrees)). Considering the current path 561D, the phase of the current signal output at the downstream node $561D_2$ will be 0 degrees (phase of the current signals output from downstream nodes $531B_2$ and $532D_2$ (90 degrees)+ phase D of the second sub-stage mixing signal (270 degrees)). The two current signals output at downstream nodes $561A_2$ and $561D_2$ thus have the same phase (0 degrees), and the current paths carrying these signals are summed together between the second mixer sub-stage 560 and the output-current nodes 571 and 572, as shown in FIG. 12. The two current signals output at downstream nodes $561A_2$ and $561D_2$ are also summed together with the two current signals output at downstream nodes $562C_2$ and $562B_2$, which have a phase of 0 degrees as well, as shown in FIG. 12. It will be appreciated that the other current paths are combined in similar ways as shown in FIG. 12 and duplicate description is omitted.

It will be appreciated that the downstream nodes of the first and second arrays 531 and 532 of the first mixer sub-stage 530 are connected to the output-current nodes 571 and 572 so that current paths from the downstream nodes of the first array 531 are summed with current paths from the downstream nodes of the second array 532, respectively. Further, it will be appreciated that the downstream nodes of the first and second arrays 531 and 532 of the first mixer sub-stage 530 are connected to the output-current nodes 571 and 572 so that current paths from downstream nodes of the first mixer sub-stage 530 connected to switches controlled by opposite phases (e.g. A and C, or B and D) of the first sub-stage mixing signal are summed together. Further, it will be appreciated that the downstream nodes of the arrays 561 and 562 of the second mixer sub-stage 560 are connected to the output-current nodes 571 and 572 so that current paths from downstream nodes of the second mixer sub-stage 560 connected to switches controlled by opposite phases of the second sub-stage mixing signal (e.g. A and C, or B and D) are summed together.

The skilled person will recognize the combining of current paths in FIG. 12 as generating a balanced (e.g. double-balanced) topology or architecture, where currents combine at nodes to have contributions (e.g. by linkage or leakage) from opposite phases of the first sub-stage mixing signal and/or the second sub-stage mixing signal, as appropriate, and of course also from both the first and second input-voltage signals VINP and VINM (which also have opposing phases). Effectively, unwanted components at the frequencies of the input signals (first sub-stage mixing signal, second sub-stage mixing signal, as well as input-voltage signal) are canceled at the outputs. Indeed, the topology of FIG. 12 could be referred to as triple-balanced in view of the balancing in relation to each of the first sub-stage mixing signal, the second sub-stage mixing signal and the input-voltage signal.

It will be appreciated that the downstream nodes of the arrays 561 and 562 of the second mixer sub-stage 560 are connected to the output-current nodes 571 and 572 so that current paths from downstream nodes of the second mixer sub-stage 560 connected to switches controlled respectively by the Y (four) phases of the second sub-stage clock signal are summed together. That is, the first and second output-current signals each have contributions from all Y (four) phases of the second sub-stage mixing signal. Further, it is apparent from FIG. 12 that that the first and second output-current signals each have contributions from all X (four) phases of the first sub-stage mixing signal. The balancing therefore involves all phases of the first sub-stage mixing signal, the second sub-stage mixing signal and the input-voltage signal.

The time-interleaved signals making up the phases of the first and second sub-stage mixing signals may be generated by a voltage controlled oscillator (VCO), i.e. a local oscillator. The left side of FIG. 12 may be referred to as a "positive rail" and the right side of FIG. 12 may be referred to as a "negative rail".

Figure 13:
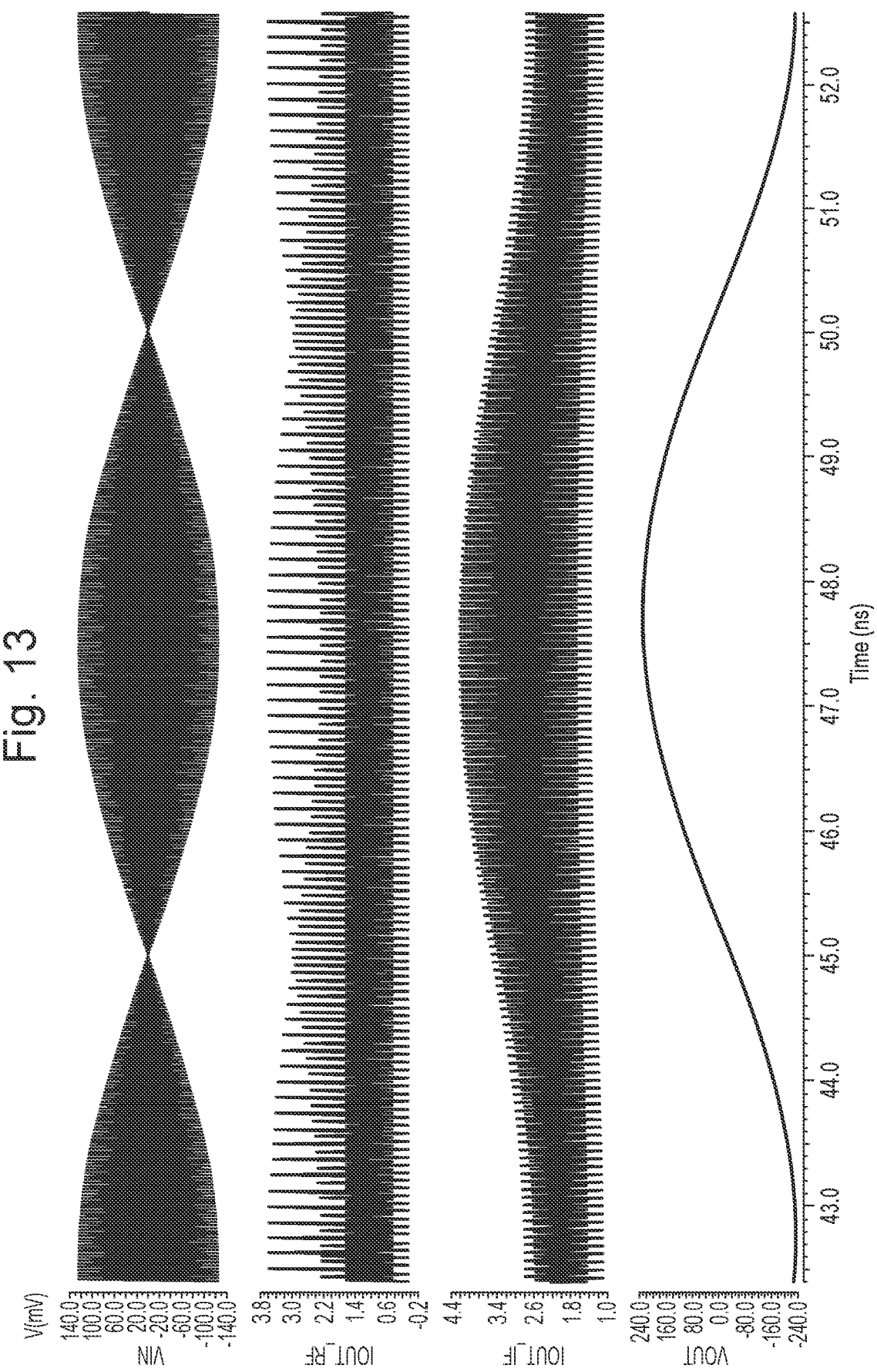
FIG. 13 is a graph useful for understanding the circuitry of FIG. 12.
Figure 14:
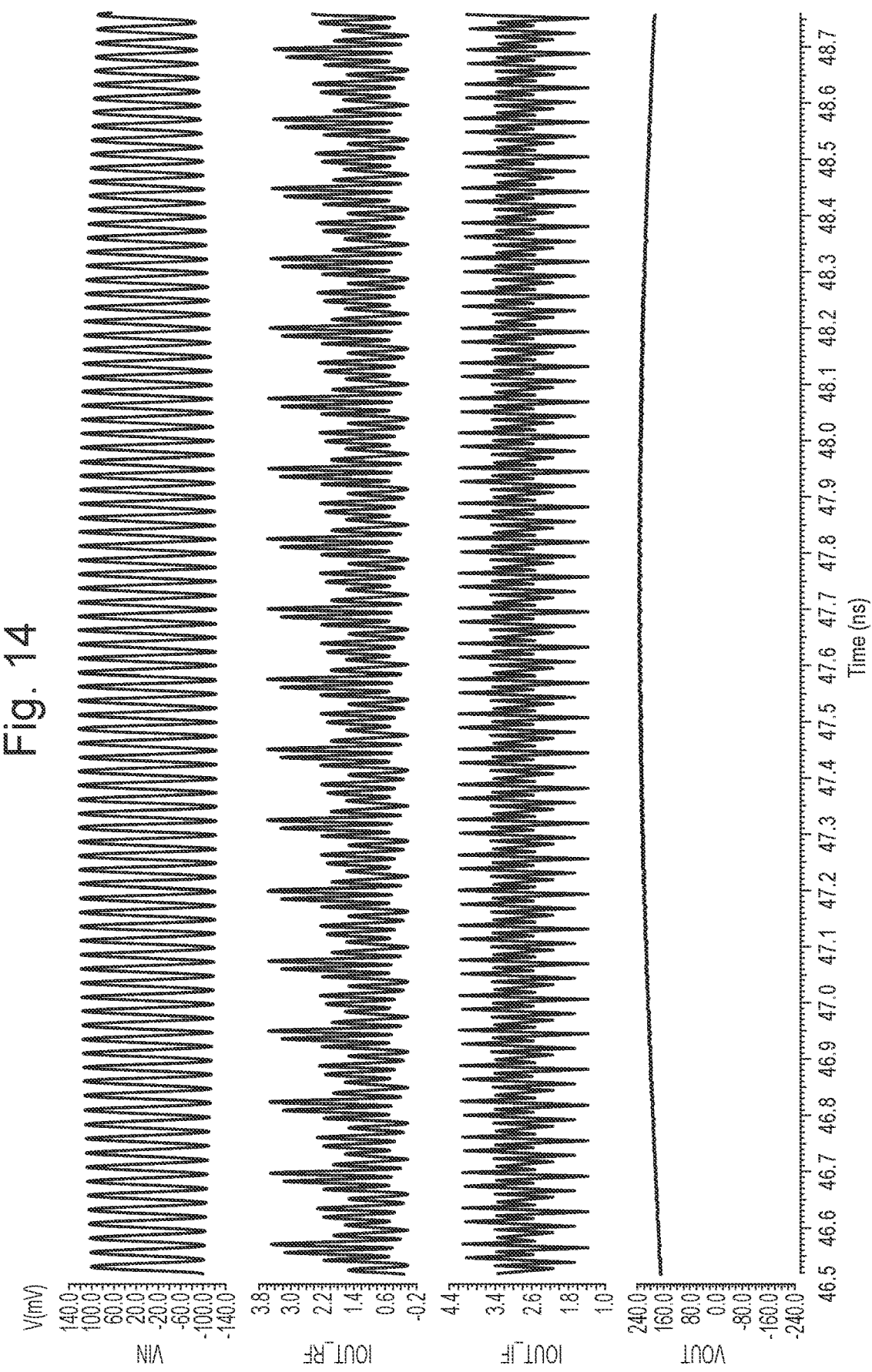
FIG. 14 is a graph useful for understanding the circuitry of FIG. 12.

FIGS. 13 and 14 are graphs useful for understanding the mixer circuitry 500. The graphs in FIGS. 13 and 14 show the differential input-voltage signal (labelled VIN), one of the mixed current signals output from the first mixer sub-stage 530 at a node where current paths join, i.e. one of the current signals input to the second mixer sub-stage 560 (labelled IOUT_RF), one of the mixed current signals output from the second mixer sub-stage 560 at a node where current paths join, i.e. the current signal at node 571 or 572 (labelled IOUT_IF), and the differential voltage output signal output between the first and second voltage-output nodes 581 and 582, each against time. The graphs in FIGS. 13 and 14 show the same signals but FIG. 14 shows the signals across a smaller range of time for more detail. A simulation was carried out to obtain the graphs in FIGS. 13 and 14. The simulation was done in a 16-nm FinFet technology. In this simulation, an RF AM (amplitude modulation) signal with the carrier frequency of 40 GHz was used as the input signal VIN, this signal carrying a baseband single tone signal of 100 MHz with power of −8 dBm (100% modulation was used in this simulation). The simulation shows that a conversion gain of around 5.5 dB is achieved for the mixer circuitry 500.

The mixer circuitry 500 can work just with two phases A and C for the first and second sub-stage mixing signals. However, four phases A to D are used to increase the conversion gain of the mixer. Further, although four phases are used (X=Y=4) in the mixer circuitry 500, this technology can be generalized to an n-phase solution (where integer n≥2). That is, other numbers of phases can be used in similar mixer circuitry.

Figure 15:
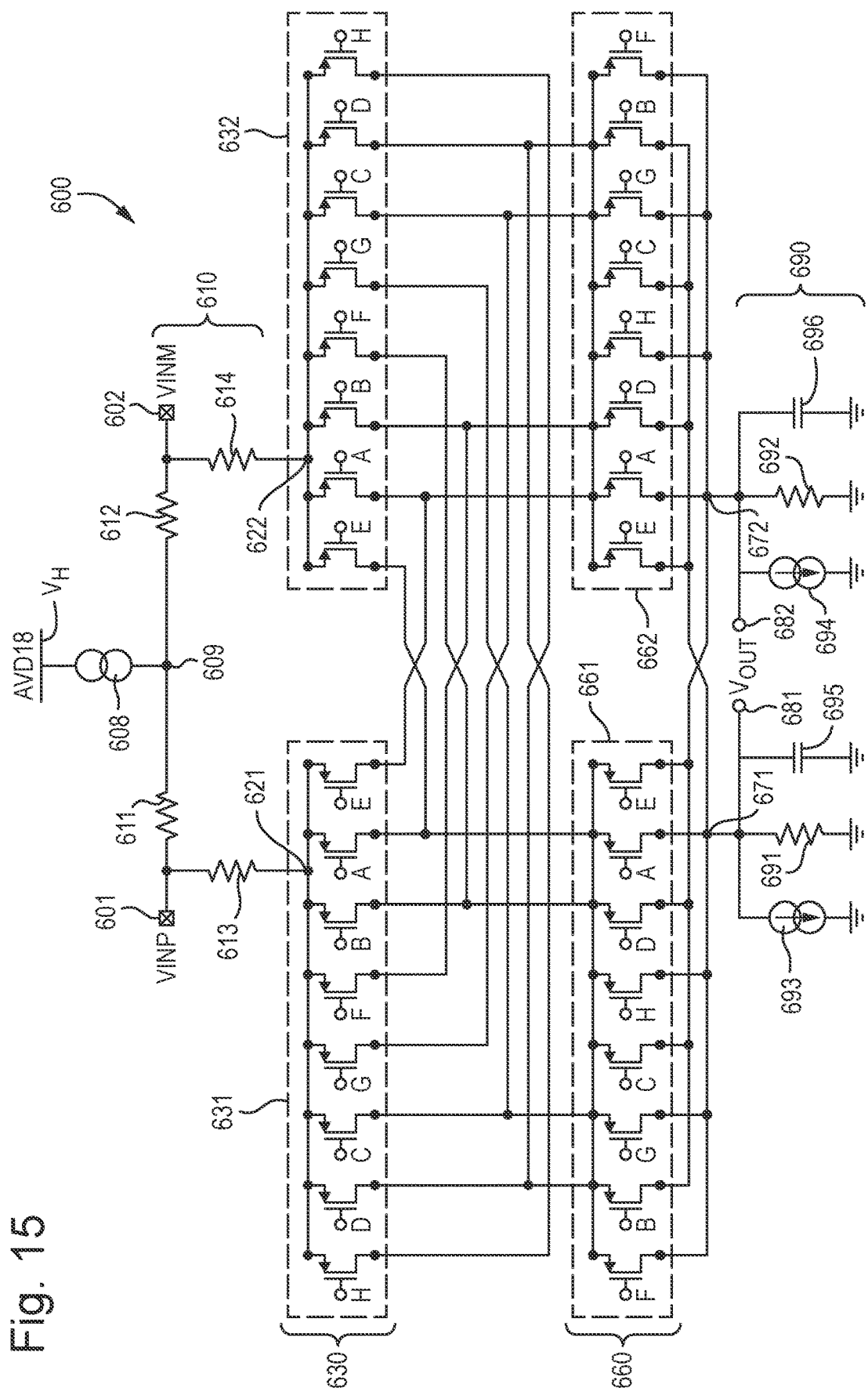
FIG. 15 is a schematic diagram of a modified second example arrangement of mixer circuitry.

FIG. 15 is a schematic diagram of a modification 600 of the second example arrangement of mixer circuitry embodying the present invention.

Mixer circuitry 600 is differential mixer circuitry and has a similar structure to mixer circuitry 500. Elements in mixer circuitry 600 corresponding to elements in mixer circuitry 500 are given like reference numerals (but starting at 600 instead of 500) and duplicate description is omitted. The difference between the mixer circuitry 600 and the mixer circuitry 500 is that the mixer circuitry 600 uses eight phases A to H of the first sub-stage mixing signal and eight phases A to H of the second sub-stage mixing signal.

Therefore the first and second arrays 631 and 632 of the first mixer sub-stage 630 and the first and second arrays 661 and 662 of the second mixer sub-stage 660 each comprise eight switches, eight upstream nodes and eight downstream nodes—i.e. X=8 and Y=8. The respective eight phases A to H are separated by 45 degrees. For example the eight phases A to H are 0, 45, 90, 135, 180, 225, 270 and 315 degrees, respectively. The operation (in the first operation mode) of mixer circuitry 600 is similar to that of the mixer circuitry 500 in how current paths carrying signals having the same phases are summed together between the first mixing sub-stage 630 and the second mixing sub-stage 660, and again between the second mixing sub-stage 660 and the first and second output-current nodes 671 and 672.

The specific combinations can be seen from FIG. 15, forming a balanced (i.e. triple-balanced, as mentioned above) topology, similar to before. Similarly to the mixer circuitry 500, the following will be appreciated looking at FIG. 15. Current paths from the downstream nodes of the first array 631 are summed with current paths from the downstream nodes of the second array 632, respectively. Current paths from downstream nodes of the first mixer sub-stage 630 connected to switches controlled by opposite phases (e.g. A and E, B and F, C and G, or D and H) of the first sub-stage nixing signal are summed together. Current paths from downstream nodes of the second mixer sub-stage 660 connected to switches controlled by opposite phases of the second sub-stage mixing signal (e.g. A and E, B and F, C and G, or D and H) are summed together. Current paths from downstream nodes of the second mixer sub-stage 660 connected to switches controlled respectively by the eight (Y=8) phases of the second sub-stage clock signal are summed together—that is, the first and second output-current signals each have contributions from all eight (Y=8) phases of the second sub-stage mixing signal. Further, the first and second output-current signals each have contributions from all eight (X=8) phases of the first sub-stage mixing signal. It will be appreciated therefore that similar considerations as explained in connection with mixer circuitry 500 apply to mixer circuitry 600.

Figure 16:
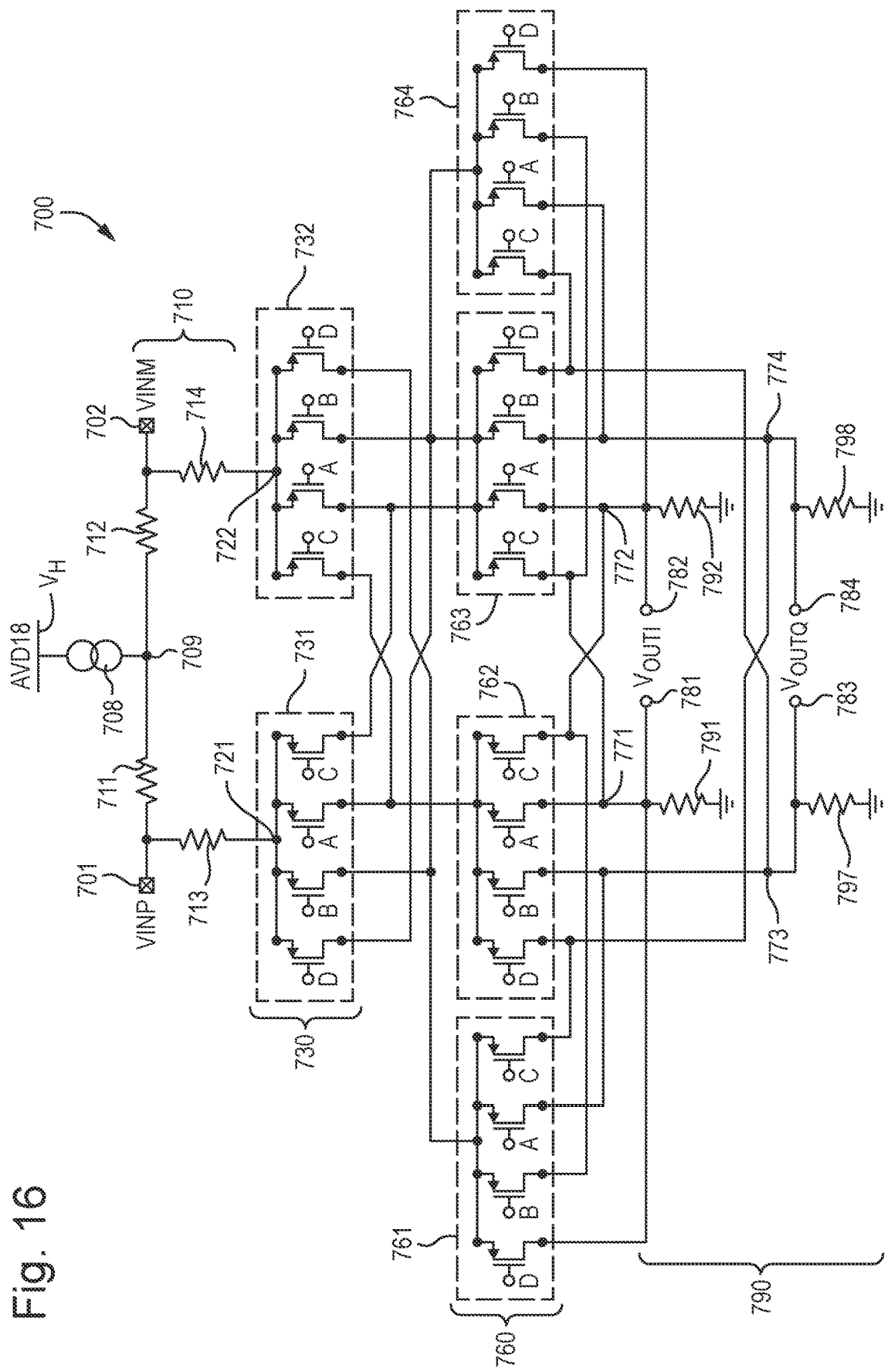
FIG. 16 is a schematic diagram of another modified second example arrangement of mixer circuitry.

FIG. 16 is a schematic diagram of a further modification 700 of the second example arrangement of mixer circuitry embodying the present invention.

Mixer circuitry 700 is differential mixer circuitry and has a similar structure to mixer circuitry 500. Elements in mixer circuitry 700 corresponding to elements in mixer circuitry 500 are given like reference numerals (but starting at 700 instead of 500) and duplicate description is omitted. The difference between the mixer circuitry 700 and the mixer circuitry 500 is that the mixer circuitry 700 is configured to provide first to fourth output-current signals in quadrature and corresponding first to fourth output-voltage signals in quadrature (i.e. having phases of 0, 90, 180 and 270 degrees).

Mixer circuitry 700 comprises first to fourth output-current nodes 771, 772, 773 and 774 to output the first to fourth output-current signals, respectively, and first to fourth output-voltage nodes 781, 782, 783 and 784, to output the first to fourth output-voltage signals, respectively. The first and second output-voltage nodes 781 and 782 are configured to output first and second output-voltage signals having opposite phases to one another (e.g. 0 and 180 degrees) and the first and second output-voltage signals define a first differential output-voltage signal ($V_{OUTI}$ in FIG. 16).

The third and fourth output-voltage nodes 783 and 784 are configured to output third and fourth output-voltage signals having opposite phases to one another (e.g. 90 and 270 degrees) and the third and fourth output-voltage signals define a second differential output-voltage signal ($V_{OUTQ}$ in FIG. 16). The mixer circuitry 700 may thus be referred to as an IQ mixer.

Another difference between the mixer circuitry 700 and the mixer circuitry 500 is that the mixer circuitry 700 comprises four arrays 761, 762, 763 and 764 in the second mixing sub-stage 760, instead of two arrays 561 and 562 in the second mixing sub-stage 560 in the mixer circuitry 500. Another difference between the mixer circuitry 700 and the mixer circuitry 500 is that the mixer circuitry 700 comprises first to fourth resistors 791, 792, 793 and 794. Although not shown, the mixer circuitry 700 may comprise first to fourth capacitances and first to fourth current sources as part of the current-to-voltage conversion stage 790 similar to the first and second capacitances 595 and 596 and first and second current sources 593 and 594 of the current-to-voltage conversion stage 590 in the mixer circuitry 500.

The operation (in the first operation mode) of mixer circuitry 700 is similar to that of the mixer circuitry 500 in how current paths carrying signals having the same phases are summed together between the first mixing sub-stage 730 and the second mixing sub-stage 760, and again between the second mixing sub-stage 760 and the first to fourth output-current nodes 771 to 774.

The specific combinations can be seen from FIG. 16, forming a balanced (i.e. triple-balanced, as mentioned above) topology, similar to before. Similarly to the mixer circuitry 500, the following will be appreciated looking at FIG. 16. Current paths from the downstream nodes of the first array 731 are summed with current paths from the downstream nodes of the second array 732, respectively. Current paths from downstream nodes of the first mixer sub-stage 730 connected to switches controlled by opposite phases (e.g. A and C, or B and D) of the first sub-stage mixing signal are summed together. Current paths from downstream nodes of the second mixer sub-stage 760 connected to switches controlled by opposite phases of the second sub-stage mixing signal (e.g. A and C, or B and D) are summed together. Current paths from downstream nodes of the second mixer sub-stage 760 connected to switches controlled respectively by the four (Y=4) phases of the second sub-stage clock signal are summed together—that is, the first to fourth output-current signals each have contributions from all four (Y=4) phases of the second sub-stage mixing signal. Further, the first to fourth output-current signals each have contributions from all four (X=4) phases of the first sub-stage mixing signal. It will be appreciated therefore that similar considerations as explained in connection with mixer circuitry 500 apply to mixer circuitry 700.

Figure 17:
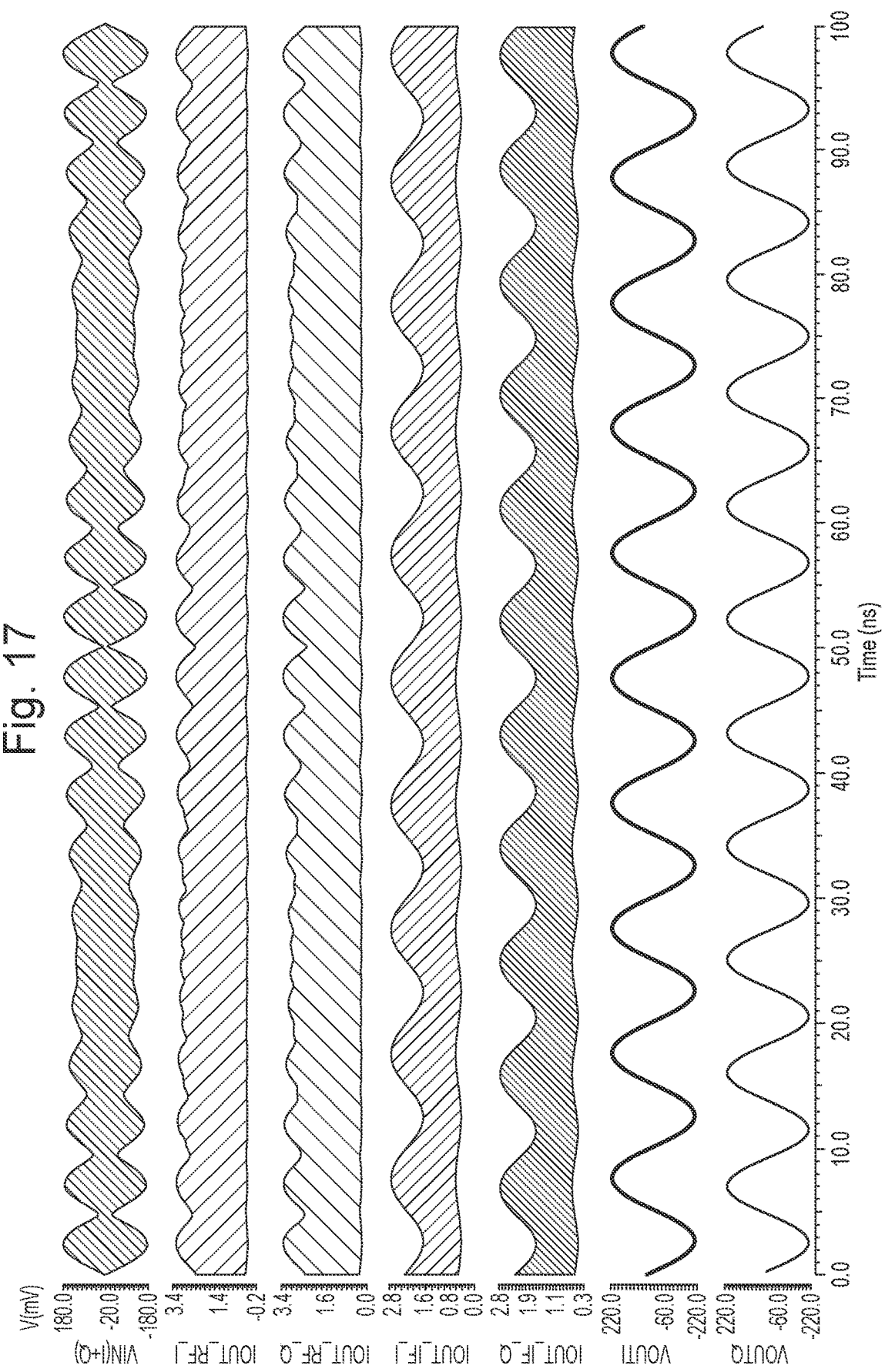
FIG. 17 is a graph useful for understanding the circuitry of FIG. 16.
Figure 18:
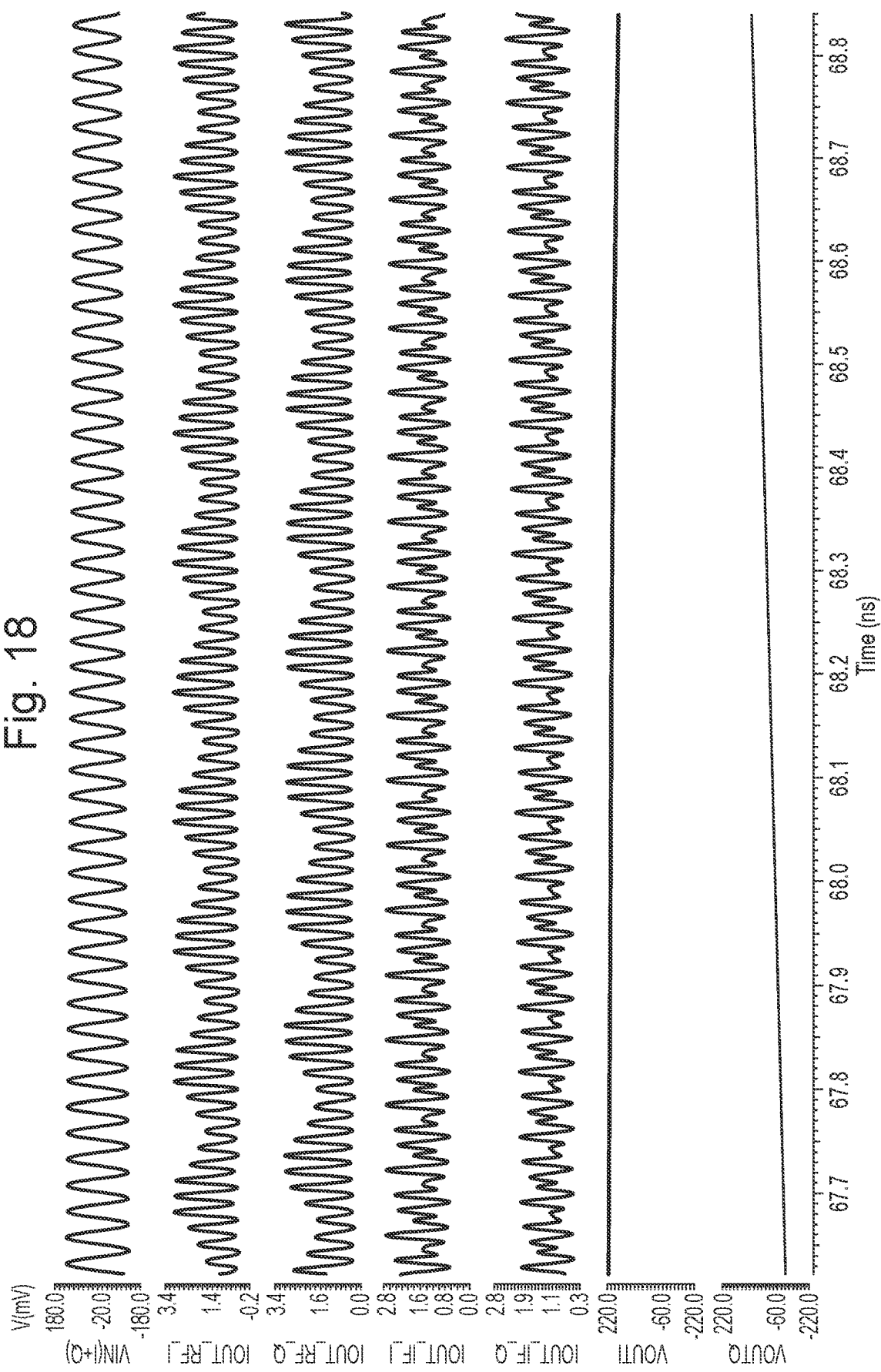
FIG. 18 is a graph useful for understanding the circuitry of FIG. 16.

FIGS. 17 and 18 are graphs useful for understanding the mixer circuitry 700. The graphs in FIGS. 17 and 18 show the differential input-voltage signal (labelled VIN(I+Q)), one of the mixed current signals output from the first mixer sub-stage 730 at a node where current paths join, i.e. one of the current signals input to the second mixer sub-stage 760 and corresponding to the "I" output signal (labelled IOUT_RF_I), one of the mixed current signals output from the first mixer sub-stage 730 at a node where current paths join, i.e. one of the current signals input to the second mixer sub-stage 760 and corresponding to the "Q" output signal (labelled IOUT_RF_Q), the mixed current signal at node 771 or 772 (labelled IOUT_IF_I), the mixed current signal at node 773 or 774 (labelled IOUT_IF_Q), the differential voltage output signal output between the first and second voltage-output nodes 781 and 782 (labelled VOUTI), and the differential voltage output signal output between the third and fourth voltage-output nodes 783 and 784 (labelled VOUTQ), each against time. The graphs in FIGS. 17 and 18 show the same signals but FIG. 18 shows the signals across a smaller range of time for more detail.

A simulation was carried out to obtain the graphs in FIGS. 17 and 18 similar to the simulation carried out to obtain the graphs in FIGS. 13 and 14 except using the mixer circuitry 700. In the simulation, the same input signal and mixing signals were used as used in the simulation carried out to obtain the graphs in FIGS. 13 and 14, except that for the graphs in FIGS. 17 and 18, the input signal has two carriers each modulated with its corresponding baseband tone signal.

That is, in the simulation the mixer circuitry 700 down-converted (i.e. changed to a lower frequency) and detected two single tones of 100 MHz on the "I channel" (i.e. in the output signal VOUTI) and 110 MHz on the "Q channel" i.e. in the output signal VOUTQ).

Figure 19:
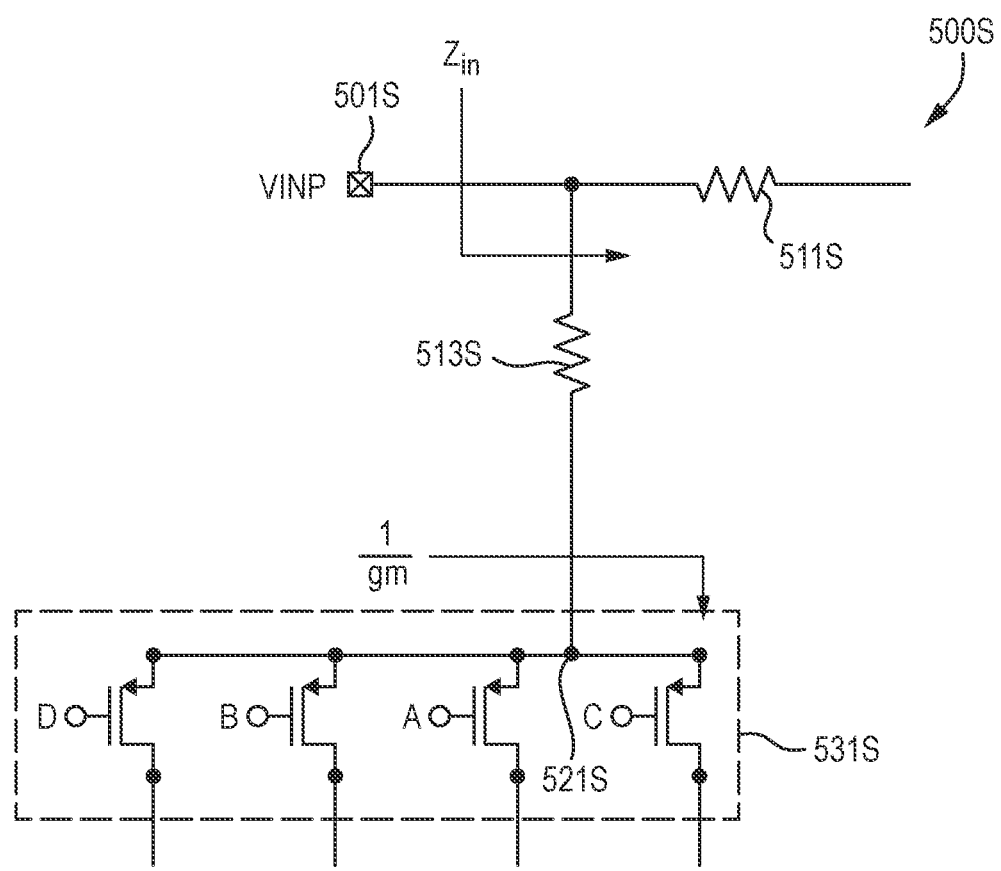
FIG. 19 is a schematic diagram useful for understanding the circuitry of FIGS. 12, 15 and 16.

FIG. 19 is a schematic diagram useful for understanding the mixer circuitry 500, 600 and 700. In FIG. 10 circuitry 500S is considered, which corresponds to part of mixer circuitry 500. Elements of circuitry 500S corresponding to elements of mixer circuitry 500 have been given the same reference signs as the elements of mixer circuitry 500 but with an S added to the end thereof. Of course, the circuitry 500S is also representative of mixer circuitry 600 and 700 and the following considerations apply to the mixer circuitry 500, 600 and 700.

The input current (i.e. the input-current signals) is the result of the voltage-to-current conversion over the "input impedance", $Z_{in}$ seen from each input input-voltage node 501 and 502 (501S is considered in FIG. 19). Ignoring the high frequency capacitive/inductive effect, the impedance seen from the source of the switches of the first mixer sub-stage is almost equal to $1/g_m$, where $g_m$ is the transconductance of each of those switches. In this case, the input current can be estimated as:

$$I_{in}=V_{in}/(R1+1/g_m) \quad (16)$$

where R1 is the resistance of the impedance (resistor) 513S (corresponding to resistor 513 in mixer circuitry 500). This current is mixed with the first and second mixer sub-stages (e.g. 530 and 560 in mixer circuitry 500) in a double balanced configuration (as described above). Since the input current passes through the first and second mixer sub-stages and finally is injected onto a load resistor, $R_L$, (i.e. the resistor 591 or 592 in mixer circuitry 500) the output voltage (the voltage of the differential output-voltage signal) can be estimated as $$V_{out}=(2/\pi) \times (2/\pi) \times I_{in} \times R_L \quad (17)$$

According to equation 17, the conversion gain of the proposed mixer architecture can be calculated as:

$$G_4=V_{out}/V_{in}=4 \times R_L/(\pi^2 \times (R1+1/g_m)) \quad (18)$$

Figure 20:
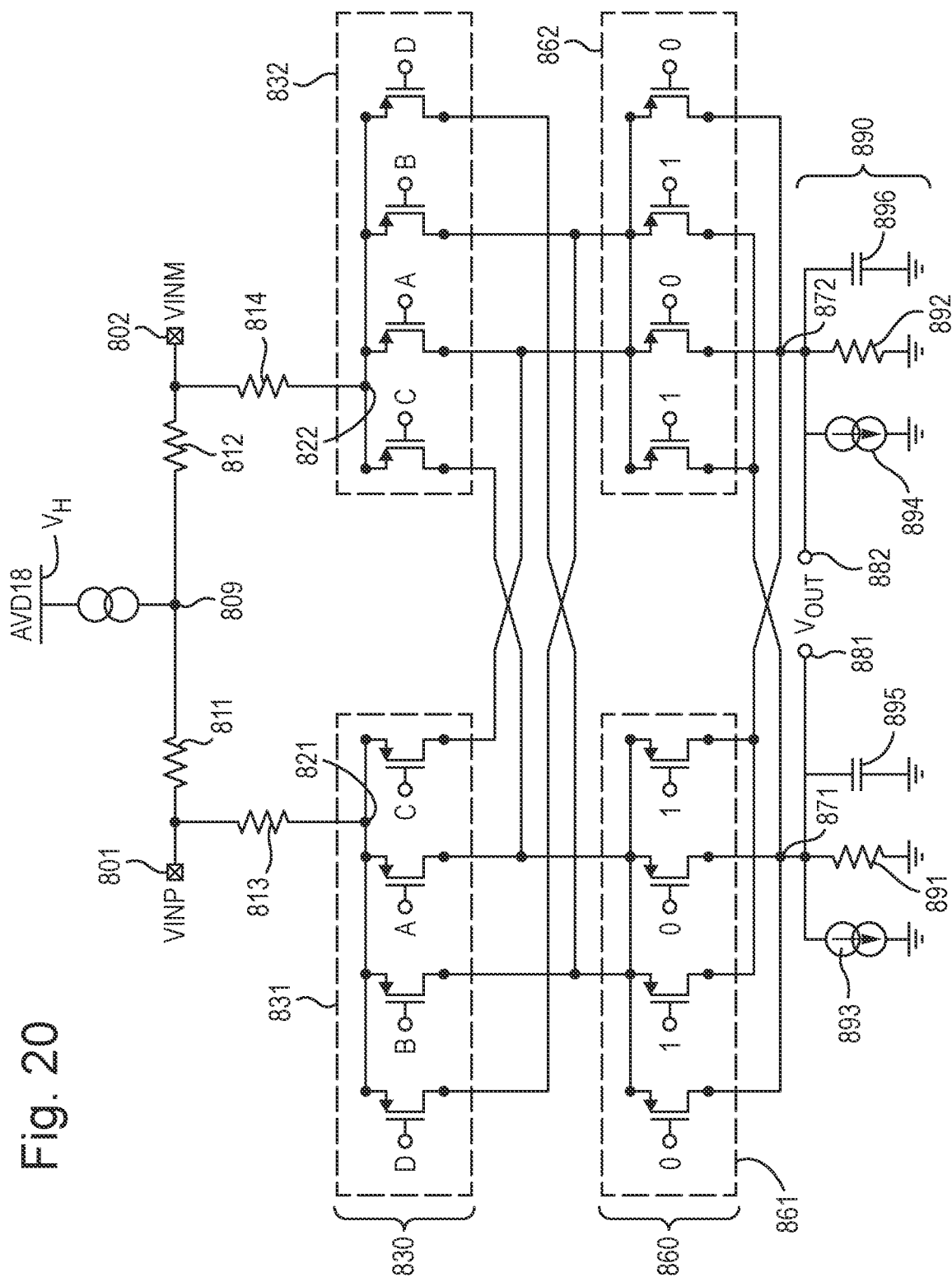
FIG. 20 is a schematic diagram of another modified second example arrangement of mixer circuitry.

FIG. 20 is a further modification 800 of the second example arrangement of mixer circuitry embodying the present invention. Mixer circuitry 800 is differential mixer circuitry. Mixer circuitry 800 is the same as mixer circuitry 500 except that instead of a Y-phase signal to control the switches of the second mixer sub-stage 860, these switches are controlled by binary signals. Therefore the mixer circuitry 800 illustrates a second operation mode of the mixer circuitry 500.

Apart from the binary signals to control the switches of the second mixer sub-stage 860, the operation of the mixer circuitry 800 is the same as that of the mixer circuitry 500 and duplicate description is omitted. By using binary signals to control the switches of the second mixer sub-stage 860 the mixer circuitry 500 can be converted into mixer circuitry 800 which effectively uses only one stage of frequency mixing, the first mixing sub-stage when operated in this way, mixer circuitry may be referred to as "direct" mixer circuitry. In FIG. 20, beside the gate of each of the switches of the second mixer sub-stage 860 is a "1" or a '0'. A "1" indicates that the binary signal (e.g. logic high, such as VDD) controlling that switch is controlling the switch to be "off"—i.e. to not allow current to flow through it. A "0" indicates that the binary signal (e.g. logic low, such as GND) controlling that switch is controlling the switch to be "on"—i.e. to allow current to flow through it. The switches of the second mixer sub-stage 860 are controlled in this way so that each switch is always either on or off in the second operation mode. It will be appreciated from FIG. 20 that the first and second output-current signals having opposite phases are provided at the first and second output nodes 871 and 872.

It will be appreciated that any mixer circuitry 500, 600 or 700 can be operated in the way that mixer circuitry 800 is operated—by using binary signals to control the switches of the second mixing sub-stage. That is, any of the mixer circuitry 500, 600 or 700 is operable according to a first operation mode (whereby the switches of the second mixing sub-stage are controlled by phases of a second sub-stage mixing signal to achieve frequency mixing, as described above with reference to FIGS. 12, 15 and 16) or according to a second operation mode (whereby the switches of the second mixing sub-stage are controlled by binary signals, effectively to convert the mixer circuitry into a "direct" mixer). This applies to other implementations/modifications of the second example arrangement of the mixer circuitry considered in this application. Of course, it would be possible to apply such binary signals to the first mixing sub-stage instead of the second mixing sub-stage.

The advantage of the second operation mode is that the conversion gain is increased to that calculated in Equation 7 because there is only one "mixing stage" (where frequency mixing is carried out). It is advantageous for mixer circuitry to be able to operate either with two mixing stages (first operation mode) or one (second operation mode) to suit different situations. The advantage of the first operation mode is that, because the input frequency is reduced twice (i.e. by two mixer sub-stages), the first and second mixing frequencies can be lower that the frequency of a single mixing signal, given limitations on the mixing signals available. It can be difficult or undesirable to generate clock signals with a high enough frequency for the second operation mode, in some scenarios.

Although mixer circuitry according to the second example arrangements and the modifications thereof has been described having particular numbers of switches in each array of the first and second mixer sub-stages (i.e. the quantities X and Y), there exist many other example implementations having different numbers for X and Y.

Briefly, as an example, a first set of example implementations which exist are example implementations in which X=4 and Y=2, among many others, including implementations in which X and Y are both greater than eight. Further, in the described example and modifications there are two (or, in the case of quadrature output signals, four) arrays in the second mixer sub-stage. There exist many other example implementations having more than two arrays in the second mixer sub-stage. Briefly, as an example, a second set of example implementations which exist are example implementations in which X=4, Y=2 and the second mixer sub-stage comprises four said arrays of switches, X=2, Y=4, and the second mixer sub-stage comprises two said arrays of switches; X=4, Y=4, and the second mixer sub-stage comprises two said arrays of switches, and, of course, many others, for example those in which X and Y are greater than eight. The second set of example implementations are particularly suitable for providing output signals in quadrature but of course they may be used for providing a single differential output signal rather than two (I and Q).

Figure 21:
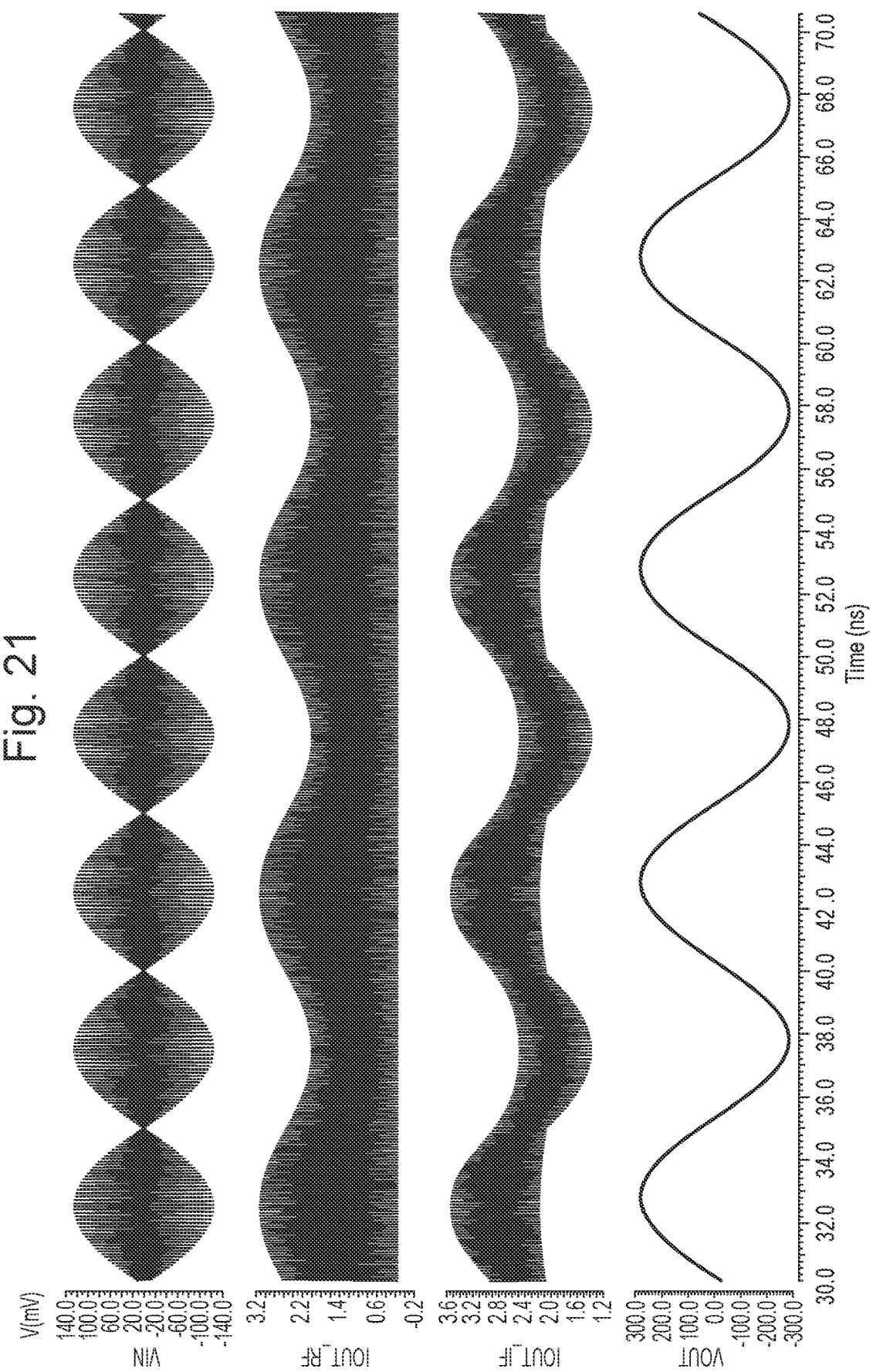
FIG. 21 is a graph useful for understanding the circuitry of FIG. 20.
Figure 22:
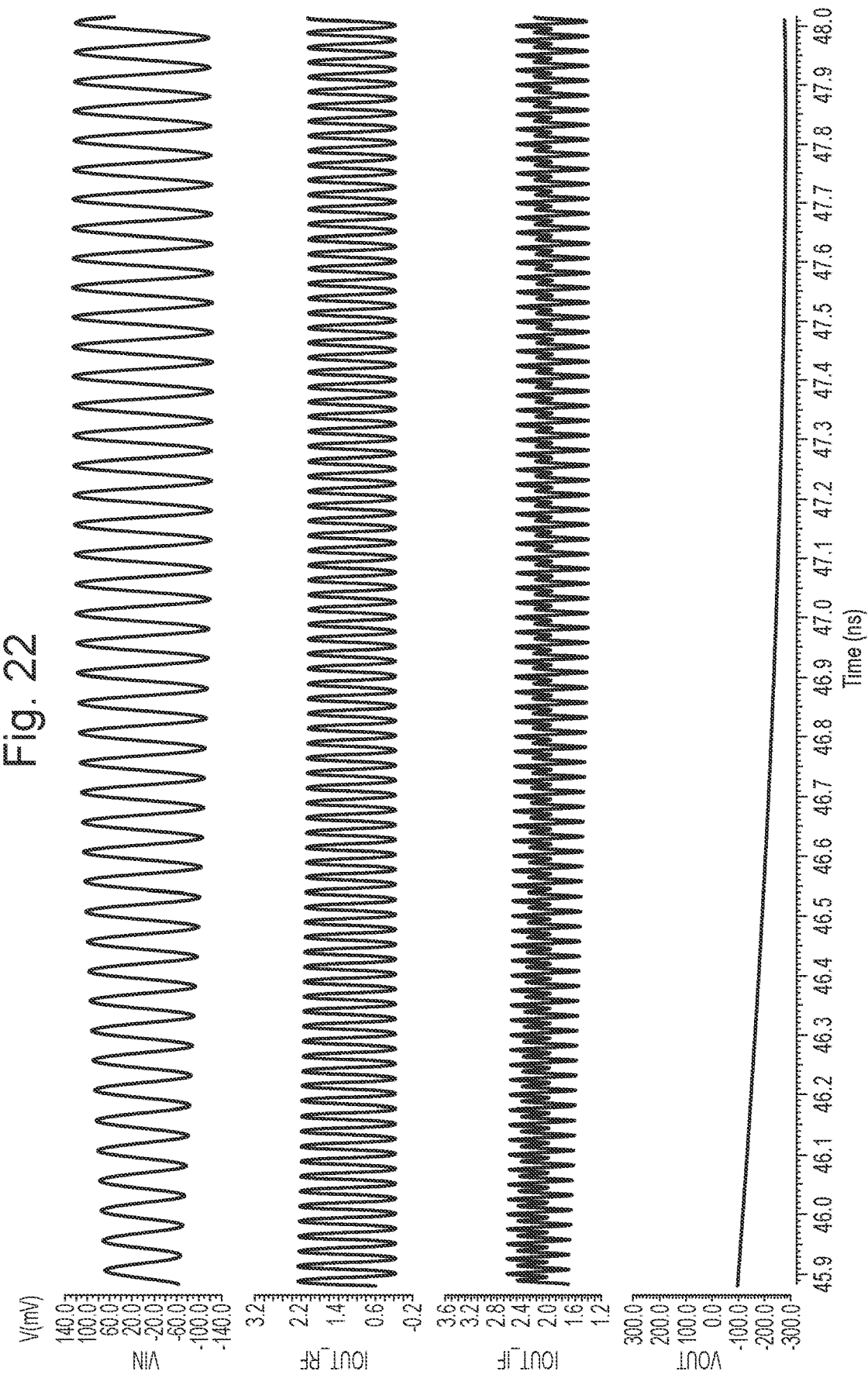
FIG. 22 is a graph useful for understanding the circuitry of FIG. 20.

FIGS. 21 and 22 are graphs useful for understanding the mixer circuitry 800 (i.e. for understanding the second operation mode). The graphs in FIGS. 21 and 22 show the differential input-voltage signal (labelled VIN), one of the mixed current signals output from the first mixer sub-stage 830 at a node where current paths join, i.e. one of the current signals input to the second mixer sub-stage 860 (labelled IOUT_RF), the mixed current signal output from the second mixer sub-stage 860 at node 871 or 872 (labelled IOUT_IF), and the differential voltage output signal output between the first and second voltage-output nodes 881 and 882 (labelled VOUT), each against time. The graphs in FIGS. 21 and 22 show the same signals but FIG. 22 shows the signals across a smaller range of time for more detail.

A simulation was carried out to obtain the graphs in FIGS. 21 and 22 similar to the simulation carried out to obtain the graphs in FIGS. 13 and 14 except using the mixer circuitry 800 (i.e. the second operation mode). Further, the input frequency used was 20 GHz, and the first mixing frequency (and, in fact, the only mixing frequency in this case) was also 20 GHz. As can be seen in FIGS. 21 and 22, the conversion gain of the mixer circuitry 800 is around 7.1 dB which is 1.6 dB higher than the conversion in the simulation of mixer circuitry 500 the results of which are shown in FIGS. 13 and 14.

Due to just having one mixer sub-stage controlled by a mixing signal in mixer circuitry 800, as discussed above, there is only one $2/\pi$ factor in the output voltage (i.e. in the equivalent equation to Equation 17 but for mixer circuitry 800). So the gain of 800 should be 3.9 dB (=20×log 10 ($\pi/2$)) higher than that of the mixer circuitry 500. However, the simulation results (i.e. the graphs in FIGS. 21 and 22) show a gain around 1.6 dB higher than that of the mixer circuitry 500. The missing gain (i.e., 3.9 dB–1.6 dB) is due to the fact that currents output at the downstream nodes of the second mixer sub-stage 860 of mixer circuitry 800 are summed together which do not have opposite phases. For example, at the output node 871, a current having a phase A is summed together with a current having a phase B, these being 90 degrees out of phase with one another. Still, the gain of mixer circuitry 800 is higher than that of mixer circuitry 500 (i.e. 1.6 dB higher).

FIG. 23 is a schematic diagram of mixer circuitry 900 embodying the present invention.

Mixer circuitry 900 is differential mixer circuitry and comprises an RF mixer 930, a VCO 923, an IF mixer 960, an analogue-to-digital converter (ADC) 924, baseband digital circuitry 925 and calibration circuitry 926. The RF mixer 930 corresponds to the first mixer sub-stage in the mixer circuitry 500, 600, 700 and 800, and the IF mixer 960 corresponds to the second mixer sub-stage in the mixer circuitry 500, 600, 700 and 800 and their operation is described above. Of course, the frequencies of the signals used at each stage are not limited to e.g. RF, IF and baseband.

The VCO 923 is configured to generate the phases of the first sub-stage mixing signal (and the second sub-stage mixing signal, where employed in the first operation mode although not shown). The RF mixer 930 receives as its input an RF analog differential input-current signal, having an input frequency, and is configured to mix the RF analog differential input-current signal with each phase of an RF-mixer mixing signal (corresponding to the first sub-stage mixing signal of circuitry 500, 600, 700 or 800) having a first mixing frequency, and to output current signals in the IF band to the IF mixer 960. The current signals output from the RF mixer are combined as described above for example with reference to mixer circuitry 500 before being input to the IF mixer 960. The IF mixer 960 is configured to mix the current signals from the RF mixer 930 with an IF-mixer mixing signal (corresponding to the second sub-stage mixing signal) having a second mixing frequency, and to output an output-current signal in baseband, which is an analogue signal having an output frequency in the baseband. In the same way as described above, the output frequency is dependent on the input frequency and the first and second mixing frequencies.

The ADC 924 is a baseband ADC in this example and is configured to convert the baseband analogue output-current signal from the IF mixer 960 into a digital signal (which may be highly parallel, where the ADC 924 uses multiple sub-ADC units), and to transmit the digital signal to the baseband digital circuitry 925. The baseband digital circuitry 925 performs digital (e.g. parallel to serial) processing and outputs a baseband digital output signal. The calibration circuitry 926 may analyze the digital signal output by the ADC 924 and/or the baseband digital circuitry 925, and calibrate operation of any of the other units based on that analysis as indicated.

Of course, the RF analog differential input-current signal, $I_{IN}$, could have any frequency and is not limited to an RF signal, and the first and second mixing frequencies are also not limited. Further, the analogue output-current signal could have any frequency (dependent on the input frequency and the first and second mixing frequencies) and is not limited to a baseband signal. It will be appreciated that mixer circuitry 900 can be operated according to the second operation mode described above with reference to mixer circuitry 800.

Advantageously, the mixer circuitry 900 has a similar structure to circuitry disclosed in FIG. 9 of EP2211468, with the similarity in the circuitry mixing stages disclosed herein also extending to FIG. 10 of EP2211468, and so that circuitry can be modified to be used as mixer circuitry 900. The speed and calibration benefits described in EP2211468 can accordingly be enjoyed in the mixer circuitry 900.

Mixer circuitry 500 to 900 is particularly suited for narrow-band RF applications for the following reasons. At least when operated according to the first operation mode, there are two stages of mixing (at the first and second mixer sub-stages) in mixer circuitry 500, 600, 700 and 900. Therefore, as described above, the mixing frequencies need not be as high as if there were only one stage of mixing in order to convert an input signal from RF to baseband. Further, the passive network can be tuned for impedance matching (e.g. at 50Ω) at the narrow-band frequency of interest, and also configured for noise filtering.

Looking in particular at FIG. 23, there exist approaches in which the RF analog differential input-current signal is fed directly to the ADC 924, however this requires a very wideband ADC to cope with an RF input directly. Therefore the present invention provides an approach whereby a baseband ADC may be employed (so that the ADC can consume less power, have a higher resolution, and be more easily manufactured) and where the passive network described above can be tuned so as to filter out unwanted frequency components to result in a low-noise output.

Returning to FIG. 11, it will be appreciated that one or both boosting networks 440 and 440' could be added to any of mixer circuitry 500, 600, 700, 800 and 900, as well as mixer circuitry 300, 300-1 or 300-2 as described above. That is, the voltage-to-current conversion stage 410, the mixing stage 450 and the current-to-voltage stage 490 may correspond to the corresponding stages of the mixer circuitry 500, 600, 700, 800 and 900. It will be appreciated that in the case of mixer circuitry 700, two boosting networks 440' and 440" may be provided between the output-current nodes 771 to 774, the boosting network 440' connected between the first and second output-current nodes 771 and 772 and the boosting network 440" connected between the third and fourth output-current nodes 773 and 774. Further, additional boosting networks could be added between pairs of current paths carrying current signals with opposing phases (i.e. in antiphase), e.g. between the first and second sub-mixer stages in any of mixer circuitry 500, 600, 700, 800 and 900.

As mentioned above, the switches of the mixer circuitry 300, 300-1, 300-2, 300-3, 400, 500, 600, 700, 800, 900 are shown in the Figures as PMOS transistors. The upstream nodes of the arrays of the first mixer sub-stage are the source terminals of the respective switches of the arrays of the first mixer sub-stage and the downstream nodes of the arrays of the first mixer sub-stage are the drain terminals of the respective switches of the arrays of the first mixer sub-stage. The upstream nodes of the arrays of the second mixer sub-stage are the source terminals of the respective switches of the arrays of the second mixer sub-stage and the downstream nodes of the arrays of the first mixer sub-stage are the drain terminals of the respective switches of the arrays of the second mixer sub-stage. Those switches could of course be replaced by suitable mixing device, such as a BJT transistor. Further, N-channel devices may be used in place of P-channel devices, i.e. by providing the circuitry the "other way up".

The current-to-voltage conversion stage 390, 490, 590, 690, 790 or 890 is not essential and instead any associated mixer circuitry disclosed herein may provide a current-based output. Further, the current-to-voltage conversion stage 390, 490, 590, 690, 790 or 890 may comprise any circuitry suitable for converting current signals into voltage signals and is not limited to the circuitry shown in the Figures.

As described with reference to the mixer circuitry 500, in the mixer circuitry 600, 700, 800 or 900, any of the passive networks disclosed herein could be used, and also any other circuitry for converting the first and second input-voltage signals VINP and VINM into the first and second input-current signals could be used. Further, the mixer circuitry 600, 700, 800 or 900 could operate based on a differential input-current signal and therefore the associated voltage-to-current conversion stage may not be included in the mixer circuitry 600, 700, 800 or 900.

It will be appreciated that labels like RF, IF and LO are examples only, and the frequency of signals labelled with such labels is not limited. That is, for example, an input-voltage signal $V_{RF}$ is not limited to an RF signal having a radio frequency and could be any signal having any frequency (with the same consideration applying to an output-voltage signal $V_{IF}$).

Figure 24A:
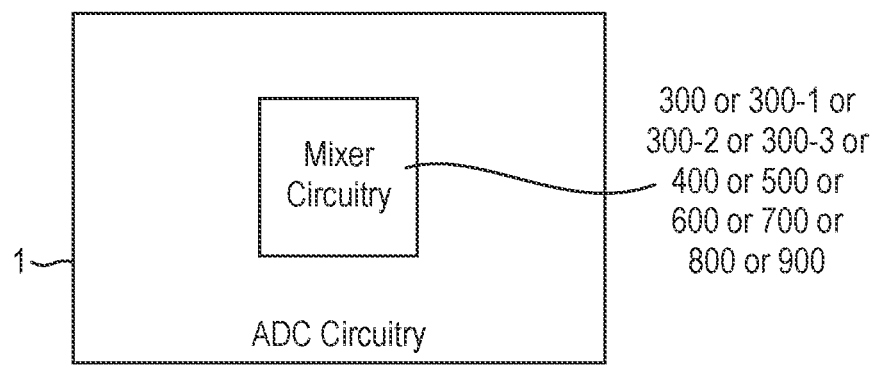
FIG. 24A is a schematic diagram of ADC circuitry.

It will be appreciated that mixer circuitry 300, 300-1, 300-2, 300-3, 400, 500, 600, 700, 800, 900 could be provided along with mixed-signal circuitry such as ADO circuitry (or, in some arrangements, DAC circuitry), which may be implemented as current-mode circuitry (for example, as described in EP2211468 in relation to its FIGS. 9 and 10). As illustrated in FIG. 24A, for example, mixer circuitry 300, 300-1, 300-2, 300-3, 400, 500, 600, 700, 800, 900 disclosed herein could be provided along with or as part of ADC circuitry 1.

Figure 24B:
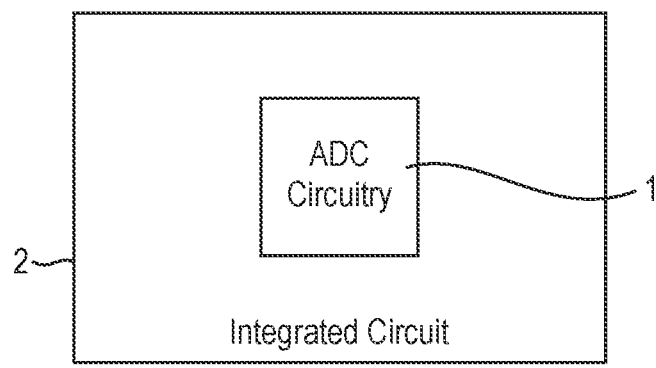
FIG. 24B is a schematic diagram of an integrated circuit.

Circuitry of the present invention may be implemented as integrated circuitry, for example on an IC chip such as a flip chip. FIG. 24B is a schematic diagram of an integrated circuit 2 comprising the ADC circuitry 1. An integrated circuit comprising the mixer circuitry 300, 300-1, 300-2, 300-3, 400, 500, 600, 700, 800, 900 could also be provided.

The present invention extends to integrated circuitry and IC chips as mentioned above, circuit boards comprising such IC chips, and communication networks (for example, internet fiber-optic networks and wireless networks) and network equipment of such networks, comprising such circuit boards. Circuitry of the present invention may also be implemented with discrete components provided on circuit boards. Circuitry of the present invention may be implemented alone (as a standalone circuit) or together with other circuitry.

In any of the above method aspects (for example, change of operation between the first and second operation modes), the various features as appropriate may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

Further embodiments may be provided within the spirit and scope of the present invention as disclosed herein.

The invention claimed is:

1. Differential mixer circuitry comprising:
   first and second input-voltage nodes and first and second input-current nodes;
   a passive network of impedances connected between the first and second input-voltage nodes and the first and second input-current nodes, and configured to convert first and second input-voltage signals received at the first and second input-voltage nodes, respectively, into first and second input-current signals provided at the first and second input-current nodes, respectively, the first and second input-voltage signals defining a differential input-voltage signal having an input frequency, and the first and second input-current signals defining a differential input-current signal; and
   a mixing stage configured to mix the differential input-current signal with at least one mixing signal having a corresponding mixing frequency and output a differential output signal having an output frequency dependent on the input frequency and each mixing frequency,
   wherein the passive network of impedances comprises:
      a tail node for connection to a voltage source;
      a first tail-side impedance connected between the first input-voltage node and the tail node and a first mixer-side impedance connected between the first input-voltage node and the first input-current node; and
      a second tail-side impedance connected between the second input-voltage node and the tail node and a second mixer-side impedance connected between the second input-voltage node and the second input-current node.

2. The differential mixer circuitry as claimed in claim 1, comprising first and second output-current nodes, wherein:
   the mixing stage is connected between the first and second input-current nodes and the first and second output-current nodes, and is configured to mix the first and second input-current signals with the at least one mixing signal to generate first and second output-current signals at the first and second output-current nodes, respectively, and defining the differential output signal.

3. The differential mixer circuitry as claimed in claim 2, wherein:
   the passive network of impedances forms a voltage-to-current conversion stage of the differential mixer circuitry; and/or
   the differential mixer circuitry comprises a current-to-voltage conversion stage connected to the output-current nodes and configured to convert the first and second output-current signals provided at the first and second output-current nodes, respectively, into first and second output-voltage signals also provided at the first and second output-current nodes, respectively.

4. The differential mixer circuitry as claimed in claim 2, wherein the mixing stage comprises at least a first mixer sub-stage, where X≥2, and the first mixer sub-stage comprises:
   first and second arrays of switches each comprising X switches, X upstream nodes and X downstream nodes, the switches of each array connected between the upstream nodes and the downstream nodes, respectively, of that array along respective current paths,
   wherein:
   the upstream nodes of the first array of the first mixer sub-stage are connected to the first input-current node and the upstream nodes of the second array of the first mixer sub-stage are connected to the second input-current node;
   the downstream nodes of the first and second arrays of the first mixer sub-stage are connected to the output-current nodes along current paths arranged so that said first and second output-current signals are provided at the first and second output-current nodes, respectively; and
   in a first operation mode of the differential mixer circuitry, the at least one mixing signal comprises at least a first sub-stage mixing signal being an X-phase mixing signal and the switches of each array are configured to be controlled by respective phases of the first sub-stage mixing signal,
   optionally wherein:
   the mixing stage comprises at least a second mixer sub-stage comprising a plurality of arrays of switches each comprising Y switches, Y upstream nodes and Y downstream nodes, where Y≥2, the switches of each array connected between the upstream nodes and the downstream nodes, respectively, of that array along respective current paths;
   the downstream nodes of the first and second arrays of the first mixer sub-stage are connected to the output-current nodes along current paths arranged to pass via the switches of the arrays of the second mixer sub-stage so that said first and second output-current signals are provided at the first and second output-current nodes, respectively; and
   in the first operation mode, the at least one mixing signal comprises at least a second sub-stage mixing signal being a Y-phase mixing signal, and the switches of each array of the second mixer sub-stage are configured to be controlled by respective phases of the second sub-stage mixing signal.

5. Integrated circuitry such as an IC chip and/or ADC circuitry comprising the circuitry as claimed in claim 1.

6. Differential mixer circuitry comprising:
   first and second input-voltage nodes and first and second input-current nodes;
   a passive network of impedances connected between the first and second input-voltage nodes and the first and second input-current nodes, and configured to convert first and second input-voltage signals received at the first and second input-voltage nodes, respectively, into first and second input-current signals provided at the first and second input-current nodes, respectively, the first and second input-voltage signals defining a differential input-voltage signal having an input frequency, and the first and second input-current signals defining a differential input-current signal; and a mixing stage configured to mix the differential input-current signal with at least one mixing signal having a corresponding mixing frequency and output a differential output signal having an output frequency dependent on the input frequency and each mixing frequency, wherein the passive network of impedances comprises:

a tail node for connection to a voltage source;

a first tail-side impedance connected between the first input-current node and the tail node and a first input-side impedance connected between the first input-current node and the first input-voltage node; and a second tail-side impedance connected between the second input-current node and the tail node and a second input-side impedance connected between the second input-current node and the second input-voltage node.

7. The differential mixer circuitry as claimed in claim 6, comprising first and second output-current nodes, wherein:

the mixing stage is connected between the first and second input-current nodes and the first and second output-current nodes, and is configured to mix the first and second input-current signals with the at least one mixing signal to generate first and second output-current signals at the first and second output-current nodes, respectively, and defining the differential output signal.

8. The differential mixer circuitry as claimed in claim 7, wherein:

the passive network of impedances forms a voltage-to-current conversion stage of the differential mixer circuitry; and/or the differential mixer circuitry comprises a current-to-voltage conversion stage connected to the output-current nodes and configured to convert the first and second output-current signals provided at the first and second output-current nodes, respectively, into first and second output-voltage signals also provided at the first and second output-current nodes, respectively.

9. The differential mixer circuitry as claimed in claim 7, wherein the mixing stage comprises at least a first mixer sub-stage, where X≥2, and the first mixer sub-stage comprises:

first and second arrays of switches each comprising X switches, X upstream nodes and X downstream nodes, the switches of each array connected between the upstream nodes and the downstream nodes, respectively, of that array along respective current paths, wherein:

the upstream nodes of the first array of the first mixer sub-stage are connected to the first input-current node and the upstream nodes of the second array of the first mixer sub-stage are connected to the second input-current node;

the downstream nodes of the first and second arrays of the first mixer sub-stage are connected to the output-current nodes along current paths arranged so that said first and second output-current signals are provided at the first and second output-current nodes, respectively; and in a first operation mode of the differential mixer circuitry, the at least one mixing signal comprises at least a first sub-stage mixing signal being an X-phase mixing signal and the switches of each array are configured to be controlled by respective phases of the first sub-stage mixing signal, optionally wherein:

the mixing stage comprises at least a second mixer sub-stage comprising a plurality of arrays of switches each comprising Y switches, Y upstream nodes and Y downstream nodes, where Y≥2, the switches of each array connected between the upstream nodes and the downstream nodes, respectively, of that array along respective current paths;

the downstream nodes of the first and second arrays of the first mixer sub-stage are connected to the output-current nodes along current paths arranged to pass via the switches of the arrays of the second mixer sub-stage so that said first and second output-current signals are provided at the first and second output-current nodes, respectively; and in the first operation mode, the at least one mixing signal comprises at least a second sub-stage mixing signal being a Y-phase mixing signal, and the switches of each array of the second mixer sub-stage are configured to be controlled by respective phases of the second sub-stage mixing signal.

10. Differential mixer circuitry comprising:

first and second input-current nodes configured to receive first and second input-current signals, respectively, the first and second input-current signals defining a differential input-current signal having an input frequency;

first and second output-current nodes configured to output first and second output-current signals, respectively, the first and second output-current signals defining a differential output-current signal; and a mixing stage connected between the first and second input-current nodes and the first and second output-current nodes, and configured to mix the differential input-current signal with at least one mixing signal having a corresponding mixing frequency to generate the differential output-current signal having an output frequency dependent on the input frequency and each mixing frequency, wherein:

the mixing stage comprises a first mixer sub-stage and a second mixer sub-stage;

and wherein:

the first mixer sub-stage is configured to perform at least part of the mixing with a first sub-stage mixing signal which is an X-phase mixing signal having a first mixing frequency, where X≥4; and/or the second mixer sub-stage is configured to perform at least part of the mixing with a second sub-stage mixing signal which is a Y-phase mixing signal having a second mixing frequency, where Y≥4.

11. The differential mixer circuitry as claimed in claim 10, wherein:

the first mixer sub-stage comprises first and second arrays of switches each comprising X switches, X upstream nodes and X downstream nodes, the switches of each of those arrays connected between the upstream nodes and the downstream nodes, respectively, of that array;

the second mixer sub-stage comprises a plurality of arrays of switches each comprising Y switches, Y upstream nodes and Y downstream nodes, the switches of each of those arrays connected between the upstream nodes and the downstream nodes, respectively, of that array; and a series of current paths connect the input-current nodes to the output-current nodes, each of those current paths passing from one of the input-current nodes via a switch of the first mixer sub-stage from its upstream node to its downstream node, via a switch of the second mixer sub-stage from its upstream node to its downstream node and then to one of the output-current nodes, and wherein:
the X switches of each array of the first mixer sub-stage are configured to be controlled by respective phases of the first sub-stage mixing signal; and/or
the Y switches of each array of the second mixer sub-stage are configured to be controlled by respective phases of the second silly-stage mixing signal.

12. The differential mixer circuitry as claimed in claim 11, wherein, in a first operation mode of the differential mixer circuitry the X switches of each array of the first mixer sub-stage are configured to be controlled by respective phases of the first sub-stage mixing signal, and the Y switches of each array of the second mixer sub-stage are configured to be controlled by respective phases of the second sub-stage mixing signal.

13. The differential mixer circuitry as claimed in claim 11, wherein, in a second operation mode of the differential mixer circuitry:
the X switches of each array of the first mixer sub-stage are configured to be controlled by respective phases of the first sub-stage mixing signal and the Y switches of each array of the second mixer sub-stage are configured to be controlled by respective control signals so that some of them are ON and some of them are OFF; or
the Y switches of each array of the second mixer sub-stage are configured to be controlled by respective phases of the second sub-stage mixing signal and the X switches of each array of the first mixer sub-stage are configured to be controlled by respective control signals so that some of them are ON and some of them are OFF.

14. The differential mixer circuitry as claimed in claim 11, wherein:
the differential mixer circuitry comprises third and fourth output-current nodes; and
the downstream nodes of the first and second arrays of the first mixer sub-stage are connected to the output-current nodes along current paths via the switches of the arrays of the second mixer sub-stage so that first to fourth output-current signals whose phases are in quadrature are provided at the first to fourth output-current nodes, respectively,
optionally wherein the second mixer sub-stage comprises at least four of said arrays of switches each comprising Y switches.

15. The differential mixer circuitry as claimed in claim 10, further comprising:
first and second input-voltage nodes and first and second input-current nodes; and
a passive network of impedances connected between the first and second input-voltage nodes and the first and second input-current nodes, and configured to convert first and second input-voltage signals received at the first and second input-voltage nodes, respectively, into the first and second input-current signals provided at the first and second input-cu mt nodes, respectively, the first and second input-voltage signals defining a differential input-voltage signal having said input frequency.

16. Differential mixer circuitry comprising:
first and second input-voltage nodes and first and second input-current nodes;
a passive network of impedances connected between the first and second input-voltage nodes and the first and second input-current nodes, and configured to convert first and second input-voltage signals received at the first and second input-voltage nodes, respectively, into first and second input-current signals provided at the first and second input-current nodes, respectively, the first and second input-voltage signals defining a differential input-voltage signal having an input frequency, and the first and second input-current signals defining a differential input-current signal;
a mixing stage configured to mix the differential input-current signal with at least one mixing signal having a corresponding mixing frequency and output a differential output signal having an output frequency dependent on the input frequency and each mixing frequency; and
a pair of auxiliary transistors with their source terminals connected via respective impedances to respective auxiliary voltage sources, with their drain terminals connected to respective nodes at corresponding locations on a pair of said current paths carrying current signals having opposing phases, respectively, and with their gate terminals connected to each other's drain terminals.

17. Analogue-to-digital converter circuitry comprising:
differential mixer circuitry configured to:
receive an analogue differential input-current signal having an input frequency;
mix the differential input-current signal with first and second sub-stage mixing signals having first and second mixing frequencies, respectively; and
output an analogue differential output-current signal having an output frequency dependent on the input frequency and the first and second mixing frequencies; and
a current-mode analogue-to-digital converter configured to convert the analogue differential output-current signal into a digital signal,
wherein the differential mixer circuitry comprises first and second mixer sub-stages, the first mixer sub-stage configured to be controlled by X phases of a first sub-stage mixing signal and the second mixer sub-stage configured to be controlled by Y phases of a second sub-stage mixing signal, where X≥4 and Y≥4.

* * * * *